United States Patent
Saruki et al.

(10) Patent No.: US 8,604,780 B2
(45) Date of Patent: Dec. 10, 2013

(54) ROTATING FIELD SENSOR

(75) Inventors: Shunji Saruki, Tokyo (JP); Hiraku Hirabayashi, Tokyo (JP)

(73) Assignee: TDK Corporation, Tokyo (JP)

( * ) Notice: Subject to any disclaimer, the term of this patent is extended or adjusted under 35 U.S.C. 154(b) by 394 days.

(21) Appl. No.: 13/164,427

(22) Filed: Jun. 20, 2011

(65) Prior Publication Data

US 2012/0038351 A1 Feb. 16, 2012

(30) Foreign Application Priority Data

Aug. 11, 2010 (JP) ................................. 2010-179934

(51) Int. Cl.
*G01B 7/30* (2006.01)
*G01B 7/14* (2006.01)

(52) U.S. Cl.
USPC ............. 324/207.25; 324/207.12; 324/207.21

(58) Field of Classification Search
None
See application file for complete search history.

(56) References Cited

U.S. PATENT DOCUMENTS

| 6,943,544 B2 | 9/2005 | Waffenschmidt |
| 7,852,070 B2 * | 12/2010 | Yamada et al. ........... 324/207.25 |
| 2002/0105445 A1 * | 8/2002 | Shirai et al. ....................... 341/7 |
| 2009/0206827 A1 * | 8/2009 | Aimuta et al. ............ 324/207.25 |

FOREIGN PATENT DOCUMENTS

| JP | A-2003-065795 | 3/2003 |
| JP | A-2005-315696 | 11/2005 |
| JP | A-2009-186410 | 8/2009 |

* cited by examiner

*Primary Examiner* — Minh N Tang
(74) *Attorney, Agent, or Firm* — Oliff & Berridge, PLC

(57) ABSTRACT

A field generation unit generates a rotating magnetic field including a first partial magnetic field in a first position and a second partial magnetic field in a second position. The first and second partial magnetic fields differ in direction by 180° and rotate in the same direction of rotation. A first detection unit located in the first position has first and second detection circuits whose output signals differ in phase by ¼ the period. A second detection unit located in the second position has third and fourth detection circuits whose output signals differ in phase by ¼ the period. A detected value of the angle that the direction of the rotating magnetic field in a reference position forms with respect to a reference direction is calculated based on a first signal generated from the output signals of the first and third detection circuits and a second signal generated from the output signals of the second and fourth detection circuits.

17 Claims, 18 Drawing Sheets

ROTATING FIELD SENSOR

BACKGROUND OF THE INVENTION

1. Field of the Invention

The present invention relates to a rotating field sensor for detecting an angle that the direction of a rotating magnetic field forms with respect to a reference direction.

2. Description of the Related Art

In recent years, rotating field sensors have been widely used to detect the rotational position of an object in various applications such as detecting the rotational position of an automotive steering wheel. Rotating field sensors are used not only to detect the rotational position of an object but also to detect a linear displacement of an object. Systems using rotating field sensors are typically provided with means (for example, a magnet) for generating a rotating magnetic field whose direction rotates in conjunction with the rotation or linear movement of the object. The rotating field sensors use magnetic detection elements to detect the angle that the direction of the rotating magnetic field forms with respect to a reference direction. The rotational position or linear displacement of the object is thus detected.

There has been known a rotating field sensor that has two bridge circuits (Wheatstone bridge circuits) as shown in U.S. Pat. No. 6,943,544 B2. In this rotating field sensor, each of the two bridge circuits includes four magnetoresistive elements (hereinafter referred to as MR elements) serving as magnetic detection elements. Each of the bridge circuits detects the intensity of a component of the rotating magnetic field in one direction, and outputs a signal that indicates the intensity. The output signals of the two bridge circuits differ in phase by ¼ the period of the output signals of the bridge circuits. The angle that the direction of the rotating magnetic field forms with respect to a reference direction is calculated based on the output signals of the two bridge circuits.

Various types of rotating field sensors have heretofore been proposed that have a pair of magnetic detection elements for outputting a pair of detection signals having a phase difference of 180°. For example, JP-A-2009-186410 describes a rotation detecting apparatus including an encoder and a sensor unit. In the rotation detecting apparatus, the encoder has a portion to be detected that is arranged concentrically to the center of rotation of a rotating member. The magnetic property of the portion to be detected alternates in the circumferential direction. In the rotation detecting apparatus, the detecting part of the sensor unit includes a pair of magnetic detection elements of the same type. The magnetic detection elements are arranged so as to coincide in phase in the circumferential direction of the encoder and differ in phase by 180° in the direction of flow of magnetic flux.

JP-A-2009-186410 describes that the output signals of the pair of magnetic detection elements can be input to a differential line receiver to eliminate the effect of electrical noise that the transmission signals in the cable undergo from outside.

JPA-2005-315696 describes a rotation angle detecting apparatus including a magnet that rotates with the rotation of a rotating body, and first and second groups of magnetic detection elements. In the rotation angle detecting apparatus, the magnet is formed in a cylindrical shape and is magnetized to two poles, or an N pole and an S pole, in parallel. The first and second groups of magnetic detection elements each include four Hall devices serving as the magnetic detection elements, which are arranged at intervals of 90° around the rotating axis of the magnet. The four Hall devices H1 to H4 of the first group of magnetic detection elements and the four Hall devices H5 to H8 of the second group of magnetic detection elements are alternately arranged at intervals of 45°. The four Hall devices H1 to H4 of the first group of magnetic detection elements output signals of sinusoidal waveform with a phase difference of 90° from each other. Similarly, the four Hall devices H5 to H8 of the second group of magnetic detection elements output signals of sinusoidal waveform with a phase difference of 90° from each other.

The rotation angle detecting apparatus described in JP-A-2005-315696 generates difference data from the output signals of two Hall devices that lie at an interval of 180°, and detects the rotation angle of the rotating body based on the difference data. Specifically, the rotation angle detecting apparatus generates difference data H1−H2, H3−H4, H6−H5, and H8−H7 on respective four pairs of two Hall devices at an interval of 180°, i.e., H1 and H2, H3 and H4, H5 and H6, and H7 and H8. A rotation angle $\theta1$ that is detected by the first group of magnetic detection elements is calculated from the difference data H1−H2 and the difference data H3−H4. A rotation angle $\theta2$ that is detected by the second group of magnetic detection elements is calculated from the difference data H6−H5 and the difference data H8−H7.

JP-A-2005-315696 describes that the generation of the difference data from the output signals of two Hall devices at an interval of 180° can cancel the difference between the center of the magnet and the center of the Hall array of the eight Hall devices. JP-A-2005-315696 further describes that the rotation angle detected by the first group of magnetic detection elements and that detected by the second group of magnetic detection elements are compared to determine the presence or absence of the occurrence of an abnormal condition.

The magnetic detection elements of a rotating field sensor sometimes undergo not only the rotating magnetic field to detect but also a magnetic field other than the rotating magnetic field to detect. Such a magnetic field other than the rotating magnetic field will hereinafter be referred to as noise field. Examples of the noise field include a leakage magnetic field from a motor and the magnetism of the earth. When a noise field is thus applied to the magnetic detection elements, the magnetic detection elements detect a composite magnetic field resulting from a combination of the rotating magnetic field and the noise field. If the rotating magnetic field to detect and the noise field differ in direction, the angle detected by the rotating field sensor includes some error. For example, suppose that the rotating magnetic field to detect, in terms of magnetic flux density, has a magnitude of 20 mT, the noise field has a magnitude equivalent to the earth's magnetism, or 0.05 mT, and the direction of the noise field is orthogonal to that of the rotating magnetic field to detect. In such a case, the direction of the composite magnetic field is different from that of the rotating magnetic field to detect by 0.14°. As a result, the angle detected by the rotating field sensor includes an error of 0.14°. This shows that if, for example, an angle accuracy (resolution) of 0.1° is required of the angle to be detected by the rotating field sensor, even the earth's magnetism can be an extremely large noise source.

To reduce such errors in the angle detected by the rotating field sensor resulting from the noise field, a possible measure is to cover the magnetic detection elements and the magnet that generates the rotating magnetic field with a magnetic shield integrated with the rotating field sensor. If the noise field source is known, a magnetic shield can be provided between the noise field source and the magnetic detection elements. Such measures, however, have the drawbacks of making the design of the rotating field sensor including the magnetic shield large in scale, increasing the cost of the rotating field sensor, and placing various constraints on the assembly steps and on the installation of the rotating field sensor.

According to the rotation detecting apparatus described in JP-A-2009-186410, electrical noise produces errors of the same sign in the output signals of the pair of magnetic detection elements. Therefore, determining the difference between the output signals of the pair of magnetic detection elements can reduce errors in the detected angle resulting from the electrical noise. In the rotation detecting apparatus described in JP-A-2009-186410, however, a noise field produces errors of opposite signs in the output signals of the pair of magnetic detection elements. Determining the difference between the output signals of the pair of magnetic detection elements therefore cannot reduce errors in the detected angle resulting from the noise field.

According to the rotation angle detecting apparatus described in JP-A-2005-315696, the generation of difference data from the output signals of two Hall devices that lie at an interval of 180° can reduce errors in the detected angle resulting from the noise field. To obtain a detected angle, i.e., an angle θ1 or θ2, however, the rotation angle detecting apparatus needs at least four magnetic detection elements (Hall devices) that are arranged at intervals of 90° around the rotating axis of the magnet. The rotation angle detecting apparatus described in JP-A-2005-315696 thus has a drawback that its application is limited to cases where the four magnetic detection elements can be arranged at intervals of 90°.

OBJECT AND SUMMARY OF THE INVENTION

It is an object of the present invention to provide a rotating field sensor that makes it possible to reduce errors in detected angles resulting from a noise field and reduce the installation locations of magnetic detection elements.

A rotating field sensor of the present invention detects an angle that the direction of a rotating magnetic field in a reference position forms with respect to a reference direction. The rotating field sensor of the present invention includes a field generation unit that generates the rotating magnetic field. The rotating magnetic field generated by the field generation unit includes a first partial magnetic field in a first position and a second partial magnetic field in a second position. The first partial magnetic field and the second partial magnetic field differ in direction by 180° and rotate in the same direction of rotation. The rotating field sensor of the present invention further includes: a first detection unit that detects a first applied field in the first position, the first applied field including the first partial magnetic field as its main component; and a second detection unit that detects a second applied field in the second position, the second applied field including the second partial magnetic field as its main component.

The first detection unit has a first detection circuit that detects the intensity of a component of the first applied field in a first direction and outputs a signal indicating the intensity, and a second detection circuit that detects the intensity of a component of the first applied field in a second direction and outputs a signal indicating the intensity. The second detection unit has a third detection circuit that detects the intensity of a component of the second applied field in a third direction and outputs a signal indicating the intensity, and a fourth detection circuit that detects the intensity of a component of the second applied field in a fourth direction and outputs a signal indicating the intensity. The first direction and the third direction are parallel to each other. The second direction and the fourth direction are parallel to each other. Each of the first to fourth detection circuits includes at least one magnetic detection element.

The output signals of the first to fourth detection circuits have the same period. The output signal of the second detection circuit differs from the output signal of the first detection circuit in phase by an odd number of times ¼ the period. The output signal of the third detection circuit differs from the output signal of the first detection circuit in phase by an integer multiple of ½ the period. The output signal of the fourth detection circuit differs from the output signal of the third detection circuit in phase by an odd number of times ¼ the period.

The rotating field sensor of the present invention further includes: a first arithmetic circuit that generates a first signal having a correspondence relationship with both the intensity of the component of the first applied field in the first direction and the intensity of the component of the second applied field in the third direction, based on the output signals of the first and third detection circuits; a second arithmetic circuit that generates a second signal having a correspondence relationship with both the intensity of the component of the first applied field in the second direction and the intensity of the component of the second applied field in the fourth direction, based on the output signals of the second and fourth detection circuits; and a third arithmetic circuit that calculates a detected angle value having a correspondence relationship with the angle that the direction of the rotating magnetic field in the reference position forms with respect to the reference direction, based on the first and second signals.

According to the rotating field sensor of the present invention, the field generation unit generates a rotating magnetic field that includes the first partial magnetic field in the first position and the second partial magnetic field in the second position. The first partial magnetic field and the second partial magnetic field differ in direction by 180° and rotate in the same direction of rotation. According to the present invention, the first arithmetic circuit generates a first signal that has a correspondence relationship with both the intensity of the component of the first applied field in the first direction and the intensity of the component of the second applied field in the third direction, based on the output signals of the first and third detection circuits. Furthermore, according to the present invention, the second arithmetic circuit generates a second signal that has a correspondence relationship with both the intensity of the component of the first applied field in the second direction and the intensity of the component of the second applied field in the fourth direction, based on the output signals of the second and fourth detection circuits. Then, based on the first and second signals, the third arithmetic circuit calculates the detected angle value having a correspondence relationship with the angle that the direction of the rotating magnetic field in the reference position forms with respect to the reference direction.

A noise field other than the rotating magnetic field may be applied to the rotating field sensor of the present invention from outside. In this case, the first applied field may be a composite magnetic field resulting from a combination of the first partial magnetic field and the noise field, and the second applied field may be a composite magnetic field resulting from a combination of the second partial magnetic field and the noise field. When a noise field other than the rotating magnetic field is applied to the rotating field sensor of the present invention from outside, the noise components produced in the output signals of the first and third detection circuits by the noise field have a value with opposite signs. Also, the noise components produced in the output signals of the second and fourth detection circuits by the noise field have a value with opposite signs. Consequently, according to the present invention, it is possible to reduce errors in detected angles resulting from the noise field.

In the rotating field sensor of the present invention, the first direction and the third direction may be different from each other by 180°. The second direction and the fourth direction may be different from each other by 180°.

In the rotating field sensor of the present invention, each of the first to fourth detection circuits may include, as the at least one magnetic detection element, a pair of magnetic detection elements connected in series. In this case, each of the first to fourth detection circuits may have a Wheatstone bridge circuit that includes a first pair of magnetic detection elements connected in series and a second pair of magnetic detection elements connected in series. The magnetic detection elements may be magnetoresistive elements. Each of the magnetoresistive elements may have a magnetization pinned layer whose direction of magnetization is pinned, a free layer whose direction of magnetization varies according to the direction of a magnetic field applied thereto, and a nonmagnetic layer disposed between the magnetization pinned layer and the free layer. The directions of magnetization of the magnetization pinned layers of the magnetoresistive elements in the second detection circuit may be orthogonal to those of the magnetization pinned layers of the magnetoresistive elements in the first detection circuit. The directions of magnetization of the magnetization pinned layers of the magnetoresistive elements in the fourth detection circuit may be orthogonal to those of the magnetization pinned layers of the magnetoresistive elements in the third detection circuit.

In the rotating field sensor of the present invention, the rotating magnetic field may further include a third partial magnetic field in a third position and a fourth partial magnetic field in a fourth position. The third partial magnetic field and the fourth partial magnetic field differ in direction by 180° and rotate in the same direction of rotation as the direction of rotation of the first and second partial magnetic fields. In this case, the rotating field sensor of the present invention may further include: a third detection unit that detects a third applied field in the third position, the third applied field including the third partial magnetic field as its main component; and a fourth detection unit that detects a fourth applied field in the fourth position, the fourth applied field including the fourth partial magnetic field as its main component.

The third detection unit has a fifth detection circuit that detects the intensity of a component of the third applied field in a fifth direction and outputs a signal indicating the intensity, and a sixth detection circuit that detects the intensity of a component of the third applied field in a sixth direction and outputs a signal indicating the intensity. The fourth detection unit has a seventh detection circuit that detects the intensity of a component of the fourth applied field in a seventh direction and outputs a signal indicating the intensity, and an eighth detection circuit that detects the intensity of a component of the fourth applied field in an eighth direction and outputs a signal indicating the intensity. The fifth direction and the seventh direction are parallel to each other. The sixth direction and the eighth direction are parallel to each other. Each of the fifth to eighth detection circuits includes at least one magnetic detection element.

The output signals of the first to eighth detection circuits have the same period. The output signal of the sixth detection circuit differs from the output signal of the fifth detection circuit in phase by an odd number of times ¼ the period. The output signal of the seventh detection circuit differs from the output signal of the fifth detection circuit in phase by an integer multiple of ½ the period. The output signal of the eighth detection circuit differs from the output signal of the seventh detection circuit in phase by an odd number of times ¼ the period.

The rotating field sensor of the present invention may further include: a fourth arithmetic circuit that generates a third signal having a correspondence relationship with both the intensity of the component of the third applied field in the fifth direction and the intensity of the component of the fourth applied field in the seventh direction, based on the output signals of the fifth and seventh detection circuits; a fifth arithmetic circuit that generates a fourth signal having a correspondence relationship with both the intensity of the component of the third applied field in the sixth direction and the intensity of the component of the fourth applied field in the eighth direction, based on the output signals of the sixth and eighth detection circuits; a sixth arithmetic circuit that calculates a second detected angle value having a correspondence relationship with the angle that the direction of the rotating magnetic field in the reference position forms with respect to the reference direction, based on the third and fourth signals; and a seventh arithmetic circuit that calculates a detected value of the angle that the direction of the rotating magnetic field in the reference position forms with respect to the reference direction, based on a first detected angle value, which is the detected angle value calculated by the third arithmetic circuit, and the second detected angle value calculated by the sixth arithmetic circuit.

In the case where the rotating field sensor of the present invention includes the third and fourth detection units and the fourth to seventh arithmetic circuits mentioned above, a noise field other than the rotating magnetic field may be applied to the rotating field sensor from outside. In this case, the first applied field may be a composite magnetic field resulting from a combination of the first partial magnetic field and the noise field. The second applied field may be a composite magnetic field resulting from a combination of the second partial magnetic field and the noise field. The third applied field may be a composite magnetic field resulting from a combination of the third partial magnetic field and the noise field. The fourth applied field may be a composite magnetic field resulting from a combination of the fourth partial magnetic field and the noise field. Here, the first direction and the third direction may be different from each other by 180°. The second direction and the fourth direction may be different from each other by 180°. The fifth direction and the seventh direction may be different from each other by 180°. The sixth direction and the eighth direction may be different from each other by 180°.

In the case where the rotating field sensor of the present invention includes the third and fourth detection units and the fourth to seventh arithmetic circuits mentioned above, the first detected angle value may include a first angular error with respect to a theoretical value of the first detected angle value that is expected when the first applied field consists only of the first partial magnetic field, the second applied field consists only of the second partial magnetic field, and the directions of the first and second partial magnetic fields make an ideal rotation. The second detected angle value may include a second angular error with respect to a theoretical value of the second detected angle value that is expected when the third applied field consists only of the third partial magnetic field, the fourth applied field consists only of the fourth partial magnetic field, and the directions of the third and fourth partial magnetic fields make an ideal rotation. In this case, the first and second angular errors may make periodic changes with the same error period in response to a change of the directions of the first to fourth partial magnetic fields. The change of the first angular error may depend on a change of the first detected angle value, and the change of the second angular error may depend on a change of the second detected angle value. The first detected angle value and the second detected angle value may differ in phase by an odd number of times ½ the error period.

In the rotating field sensor of the present invention, in the case where the change of the first angular error depends on a change of the first detected angle value and the change of the second angular error depends on a change of the second detected angle value, the third position and the fourth position may be offset from the first position and the second position, respectively, by an amount equivalent to an odd number of times ½ the error period. In this case, the error period may be ¼ the period of the output signals of the respective detection circuits.

In the case where the first detected angle value includes the first angular error and the second detected angle value includes the second angular error, the first and second angular errors may make periodic changes with the same error period in response to a change of the directions of the first to fourth partial magnetic fields. The change of the first angular error may depend on a change of the directions of the first and second partial magnetic fields, and the change of the second angular error may depend on a change of the directions of the third and fourth magnetic fields. In this case, the third position and the fourth position may be offset from the first position and the second position, respectively, by an amount equivalent to an odd number of times ½ the error period. Here, the error period may be ½ the period of the rotation of the direction of the rotating magnetic field.

In the case where the change of the first angular error depends on a change of the directions of the first and second partial magnetic fields and the change of the second angular error depends on a change of the directions of the third and fourth partial magnetic fields, the first angular error may include a component that changes with the error period depending on the change of the directions of the first and second partial magnetic fields, and a component that changes with a second error period depending on a change of the first detected angle value. The second angular error may include a component that changes with the error period depending on the change of the directions of the third and fourth partial magnetic fields, and a component that changes with the second error period depending on a change of the second detected angle value. The first detected angle value and the second detected angle value may differ in phase by an odd number of times ½ the second error period.

According to the present invention, as described above, when a noise field is applied to the rotating field sensor from outside, the noise components produced in the output signals of the first and third detection circuits by the noise field have a value with opposite signs, and the noise components produced in the output signals of the second and fourth detection circuits by the noise field have a value with opposite signs. Consequently, according to the present invention, it is possible to reduce errors in detected angles resulting from the noise field. The foregoing effect of the present invention is provided by the arrangement of the first and second detection units in the first and second positions. The present invention thus makes it possible to reduce errors in detected angles resulting from the noise field and also reduce the installation locations of magnetic detection elements.

Other and further objects, features and advantages of the present invention will appear more fully from the following description.

DETAILED DESCRIPTION OF THE PREFERRED EMBODIMENTS

First Embodiment

Figure 1:
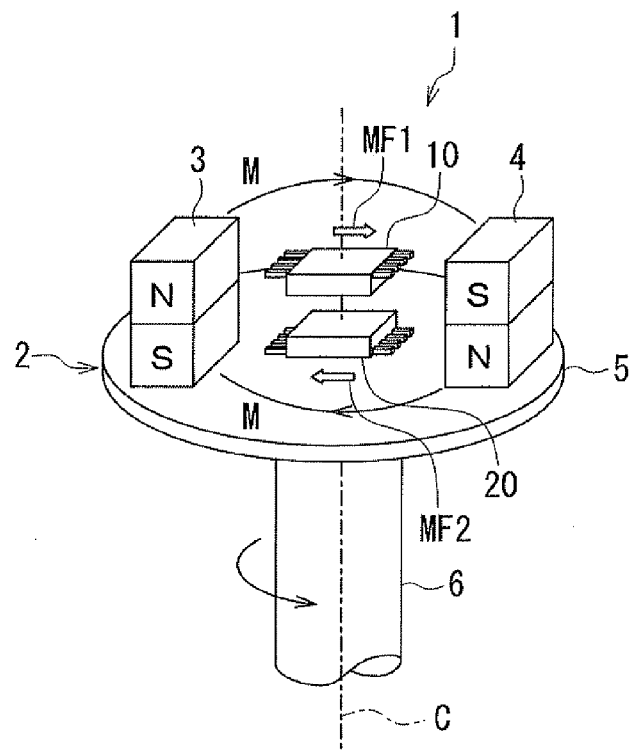
FIG. 1 is a perspective view showing the general configuration of a rotating field sensor according to a first embodiment of the invention.
Figure 2:
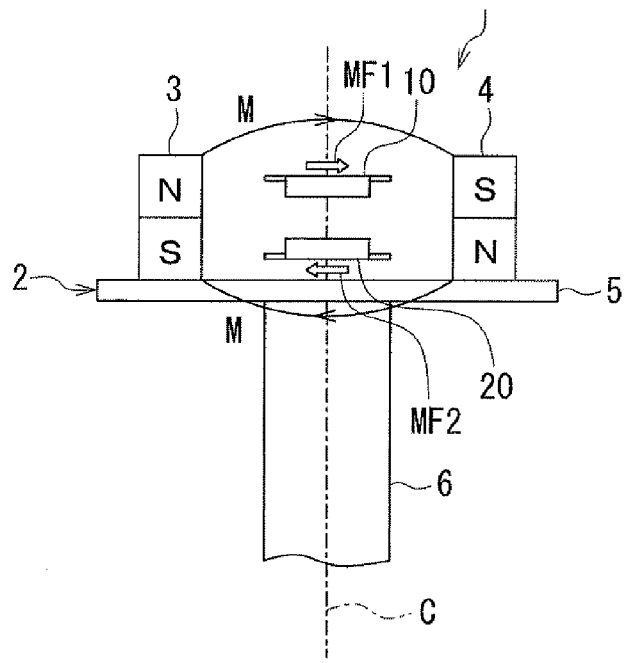
FIG. 2 is a side view showing the general configuration of the rotating field sensor according to the first embodiment of the invention.
Figure 4A:
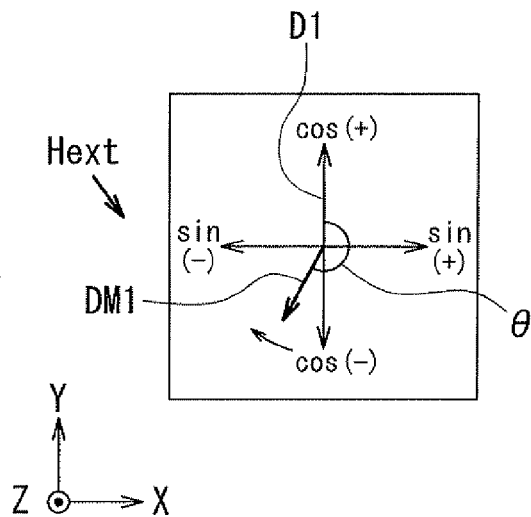
FIG. 4A is an explanatory diagram illustrating the definitions of directions and angles in the first embodiment of the invention.
Figure 4B:
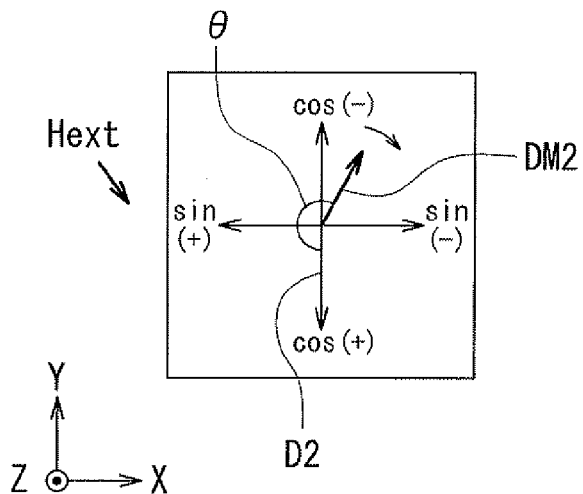
FIG. 4B is an explanatory diagram illustrating the definitions of directions and angles in the first embodiment of the invention.

Preferred embodiments of the present invention will now be described in detail with reference to the drawings. First, reference is made to FIG. 1, FIG. 2, FIG. 4A and FIG. 4B to describe the general configuration of a rotating field sensor according to a first embodiment of the invention. FIG. 1 is a perspective view showing the general configuration of the rotating field sensor according to the present embodiment. FIG. 2 is a side view showing the general configuration of the rotating field sensor according to the present embodiment. FIG. 4A and FIG. 4B are explanatory diagrams illustrating the definitions of directions and angles in the present embodiment.

A rotating field sensor 1 according to the present embodiment detects the angle that the direction of a rotating magnetic field in a reference position forms with respect to a reference direction. The rotating magnetic field includes a first partial magnetic field MF1 in a first position and a second partial magnetic field MF2 in a second position. The first partial magnetic field MF1 and the second partial magnetic field MF2 differ in direction by 180° and rotate in the same direction of rotation.

As shown in FIG. 1 and FIG. 2, the rotating field sensor 1 includes: a field generation unit 2 that generates the rotating magnetic field; a first detection unit 10 that detects a first applied field in the first position; and a second detection unit 20 that detects a second applied field in the second position. The first applied field includes the first partial magnetic field MF1 as its main component. The second applied field includes the second partial magnetic field MF2 as its main component. For the sake of convenience, in FIG. 1 and FIG. 2, the first detection unit 10 is shown in a position separate from the arrow that represents the first partial magnetic field MF1, and the second detection unit 20 is shown in a position separate from the arrow that represents the second partial magnetic field MF2. In actuality, however, the first detection unit 10 is located in the first position where the first partial magnetic field MF1 occurs, and the second detection unit 20 is located in the second position where the second partial magnetic field MF2 occurs. The definitions of directions and angles will be described in detail later.

The field generation unit 2 includes a disc part 5, and a pair of magnets 3 and 4 attached to the disc part 5. The disc part 5 is attached to one axial end of a rotating shaft 6 which is the object whose rotational position is to be detected. The rotating shaft 6 rotates about its center axis. With the rotation, the field generation unit 2 also rotates about the center of rotation C including the center axis of the rotating shaft 6. The pair of magnets 3 and 4 are arranged in symmetrical positions with respect to a virtual plane that includes the center of rotation C. Here, for the disc part 5, the lower surface in FIG. 1 and FIG. 2 will be defined as a "bottom surface", and the upper surface in FIG. 1 and FIG. 2 will be defined as a "top surface." Both the top and bottom surfaces of the disc part 5 are perpendicular to the center of rotation C. The magnets 3 and 4 are fixed to the top surface of the disc part 5. The one end of the rotating shaft 6 is fixed to the bottom surface of the disc part 5. In the field generation unit 2, the magnets 3 and 4 are rotated about the center of rotation C, whereby a rotating magnetic field is generated based on the magnetic field generated by the magnets 3 and 4.

Each of the magnets 3 and 4 has an N pole and an S pole. The N and S poles of the magnet 3 are arranged in the order of the S pole and the N pole from the top surface of the disc part 5. The N and S poles of the magnet 4 are arranged in the order of the N pole and the S pole from the top surface of the disc part 5. The direction of the rotating magnetic field generated by the pair of magnets 3 and 4 rotates about the center of rotation C with the rotation of the field generation unit 2. In FIG. 1 and FIG. 2, the major portion of the magnetic flux from the N pole of the magnet 3 to the S pole of the magnet 4 and the major portion of the magnetic flux from the N pole of the magnet 4 to the S pole of the magnet 3 are shown by curves designated by symbol M. The magnetic flux from the N pole of the magnet 3 to the S pole of the magnet 4 produces most of the first partial magnetic field MF1 in the first position. The magnetic flux from the N pole of the magnet 4 to the S pole of the magnet 3 produces most of the second partial magnetic field MF2 in the second position.

The first and second detection units 10 and 20 are arranged above the top surface of the disc part 5, between the magnets 3 and 4. More specifically, in the present embodiment, the first detection unit 10 is located in the first position on the center of rotation C where the first partial magnetic field MF1 occurs, and the second detection unit 20 is located in the second position on the center of rotation C where the second partial magnetic field MF2 occurs. In FIG. 1 and FIG. 2, the first detection unit 10 and the second detection unit 20 are shown as separate members. However, the first detection unit 10 and the second detection unit 20 may be integrated with each other as long as they are located in the first position and the second position, respectively. In the present embodiment, the direction of the first partial magnetic field MF1 is from the N pole of the magnet 3 to the S pole of the magnet 4. The direction of the second partial magnetic field MF2 is from the N pole of the magnet 4 to the S pole of the magnet 3. The direction of the first partial magnetic field MF1 and that of the second partial magnetic field MF2 are different from each other by 180°. The rotation of the field generation unit 2 rotates the first partial magnetic field MF1 and the second partial magnetic field MF2 in the same direction of rotation.

With reference to FIG. 4A and FIG. 4B, the definitions of directions and angles in the present embodiment will be described. FIG. 4A illustrates the definitions of directions and angles in the first position. FIG. 4B illustrates the definitions of directions and angles in the second position. First, a direction that is parallel to the center of rotation C shown in FIG. 1 and FIG. 2 and is away from the top surface of the disc part 5 will be defined as the Z direction. Next, two mutually-orthogonal directions on a virtual plane perpendicular to the Z direction will be defined as the X direction and Y direction. In FIG. 4A and FIG. 4B, the X direction is shown as the direction toward the right, and the Y direction is shown as the upward direction. The direction opposite to the X direction will be defined as the −X direction, and the direction opposite to the Y direction will be defined as the −Y direction.

The first position is where the first detection unit 10 detects the first applied field. In the present embodiment, the first position is located on the center of rotation C, above the top surface of the disc part 5. The arrow designated by symbol "D1" in FIG. 4A shows the direction with respect to which the first detection unit 10 indicates the direction DM1 of the first applied field. In the present embodiment, the direction D1 coincides with the Y direction. The first applied field includes the first partial magnetic field MF1 as its main component. The direction DM1 of the first applied field and the direction of the first partial magnetic field MF1 shall rotate clockwise in FIG. 4A.

The second position is where the second detection unit 20 detects the second applied field. In the present embodiment, the second position is located on the center of rotation C, above the top surface of the disc part 5, and is located closer to the top surface of the disc part 5 than is the first position. The arrow designated by symbol "D2" in FIG. 4B shows the direction with respect to which the second detection unit 20 indicates the direction DM2 of the second applied field. The direction D1 and the direction D2 is different from each other by 180°. In the present embodiment, the direction D2 coincides with the −Y direction. The second applied field includes the second partial magnetic field MF2 as its main component. The direction DM2 of the second applied field and the direction of the second partial magnetic field MF2 shall rotate clockwise in FIG. 4B.

The reference position and the reference direction may coincide with the first position and the direction D1, respectively, or with the second position and the direction D2, respectively, or may be any position and direction different from those positions and directions.

In the present embodiment, the direction D1 and the direction D2 are different from each other by 180°. The direction of the first partial magnetic field MF1 and that of the second partial magnetic field MF2 are also different from each other by 180°. Therefore, the angle that the direction of the first partial magnetic field MF1 forms with respect to the direction D1 is equal to the angle that the direction of the second partial magnetic field MF2 forms with respect to the direction D2. If the first applied field consists only of the first partial magnetic field MF1 and the second applied field consists only of the second partial magnetic field MF2, the angle that the direction DM1 of the first applied field forms with respect to the direction D1 is equal to the angle that the direction DM2 of the second applied field forms with respect to the direction D2. This angle will hereinafter be represented by symbol θ. FIG. 4A and FIG. 4B show the angle θ. The angle θ will be expressed in a positive value when seen clockwise from the direction D1 or D2, and in a negative value when seen counterclockwise from the direction D1 or D2.

The rotating field sensor 1 detects components of the first applied field in two reference directions and components of the second applied field in two reference directions, thereby detecting the angle that the direction of the rotating magnetic field in a reference position forms with respect to a reference direction. Hereinafter, the reference direction for one component of the first applied field will be referred to as a first direction. The reference direction for another component of the first applied field will be referred to as a second direction. The reference direction for one component of the second applied field will be referred to as a third direction. The reference direction for another component of the second applied field will be referred to as a fourth direction. The first direction and the third direction are parallel to each other. The second direction and the fourth direction are parallel to each other. In the present embodiment, in particular, the first direction and the third direction are different from each other by 180°, and the second direction and the fourth direction are different from each other by 180°.

The direction D1 and the direction D2 may be the same as the first direction and the third direction, respectively, or as the second direction and the fourth direction, respectively, or may be any directions different from those directions.

Figure 3:
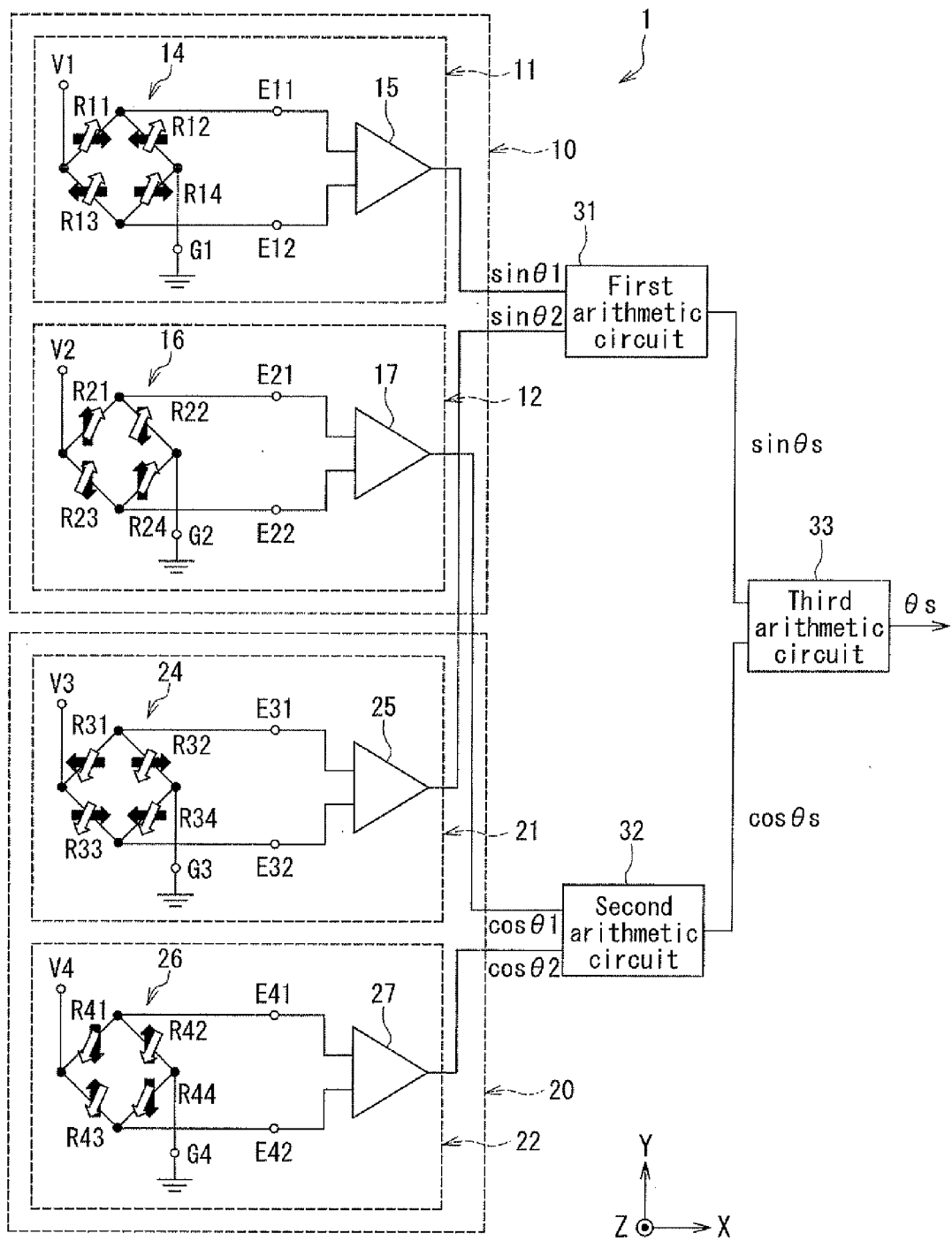
FIG. 3 is a circuit diagram showing the configuration of the rotating field sensor according to the first embodiment of the invention.

Next, the configuration of the rotating field sensor 1 will be described in detail with reference to FIG. 3. FIG. 3 is a circuit diagram showing the configuration of the rotating field sensor 1. As mentioned previously, the rotating field sensor 1 includes the first detection unit 10 and the second detection unit 20. The first detection unit 10 detects the first applied field. The first detection unit 10 has a first detection circuit 11 that detects the intensity of the component of the first applied field in the first direction and outputs a signal indicating the intensity, and a second detection circuit 12 that detects the intensity of the component of the first applied field in the second direction and outputs a signal indicating the intensity.

The second detection unit 20 detects the second applied field. The second detection unit 20 has a third detection circuit 21 that detects the intensity of the component of the second applied field in the third direction and outputs a signal indicating the intensity, and a fourth detection circuit 22 that detects the intensity of the component of the second applied field in the fourth direction and outputs a signal indicating the intensity.

The output signals of the first to fourth detection circuits 11, 12, 21, and 22 have the same period. In the following description, the period of the output signals of the first to fourth detection circuits 11, 12, 21, and 22 will be referred to as period T. The output signal of the second detection circuit 12 differs from the output signal of the first detection circuit 11 in phase by an odd number of times ¼ the period T. The output signal of the third detection circuit 21 differs from the output signal of the first detection circuit 11 in phase by an integer multiple of ½ the period T. The output signal of the fourth detection circuit 22 differs from the output signal of the third detection circuit 21 in phase by an odd number of times ¼ the period T.

The rotating field sensor 1 further includes first to third arithmetic circuits 31, 32, and 33. The first arithmetic circuit 31 generates a first signal that has a correspondence relationship with both the intensity of the component of the first applied field in the first direction and the intensity of the component of the second applied field in the third direction, based on the output signals of the first and third detection circuits 11 and 21. The second arithmetic circuit 32 generates a second signal that has a correspondence relationship with both the intensity of the component of the first applied field in the second direction and the intensity of the component of the second applied field in the fourth direction, based on the output signals of the second and fourth detection circuits 12 and 22. Based on the first signal and the second signal, the third arithmetic circuit 33 calculates a detected angle value θs that has a correspondence relationship with the angle that the direction of the rotating magnetic field in the reference position forms with respect to the reference direction. The first to third arithmetic circuits 31, 32, and 33 can be implemented by a single microcomputer, for example. The method of generating the first and second signals and the method of calculating θs will be described in detail later.

Each of the first to fourth detection circuits 11, 12, 21, and 22 includes at least one magnetic detection element. Each of the first to fourth detection circuits 11, 12, 21, and 22 may include, as the at least one magnetic detection element, a pair of magnetic detection elements connected in series. In this case, each of the first to fourth detection circuits 11, 12, 21, and 22 may have a Wheatstone bridge circuit that includes a first pair of magnetic detection elements connected in series and a second pair of magnetic detection elements connected in series. The following description will deal with the case where each of the first to fourth detection circuits 11, 12, 21, and 22 has such a Wheatstone bridge circuit.

The first detection circuit 11 has a Wheatstone bridge circuit 14 and a difference detector 15. The Wheatstone bridge circuit 14 includes a power supply port V1, a ground port G1, two output ports E11 and E12, a first pair of magnetic detection elements R11 and R12 connected in series, and a second pair of magnetic detection elements R13 and R14 connected in series. One end of each of the magnetic detection elements R11 and R13 is connected to the power supply port V1. The other end of the magnetic detection element R11 is connected to one end of the magnetic detection element R12 and the output port E11. The other end of the magnetic detection element R13 is connected to one end of the magnetic detection element R14 and the output port E12. The other end of each of the magnetic detection elements R12 and R14 is connected to the ground port G1. A power supply voltage of predetermined magnitude is applied to the power supply port V1. The ground port G1 is grounded. The difference detector 15 outputs to the first arithmetic circuit 31 a signal that corresponds to the potential difference between the output ports E11 and E12.

The second detection circuit 12 has a Wheatstone bridge circuit 16 and a difference detector 17. The Wheatstone bridge circuit 16 includes a power supply port V2, a ground port G2, two output ports E21 and E22, a first pair of magnetic detection elements R21 and R22 connected in series, and a second pair of magnetic detection elements R23 and R24 connected in series. One end of each of the magnetic detection elements R21 and R23 is connected to the power supply port V2. The other end of the magnetic detection element R21 is connected to one end of the magnetic detection element R22 and the output port E21. The other end of the magnetic detection element R23 is connected to one end of the magnetic detection element R24 and the output port E22. The other end of each of the magnetic detection elements R22 and R24 is connected to the ground port G2. A power supply voltage of predetermined magnitude is applied to the power supply port V2. The ground port G2 is grounded. The difference detector 17 outputs to the second arithmetic circuit 32 a signal that corresponds to the potential difference between the output ports E21 and E22.

The third detection circuit 21 has a Wheatstone bridge circuit 24 and a difference detector 25. The Wheatstone bridge circuit 24 includes a power supply port V3, a ground port G3, two output ports E31 and E32, a first pair of magnetic detection elements R31 and R32 connected in series, and a second pair of magnetic detection elements R33 and R34 connected in series. One end of each of the magnetic detection elements R31 and R33 is connected to the power supply port V3. The other end of the magnetic detection element R31 is connected to one end of the magnetic detection element R32 and the output port E31. The other end of the magnetic detection element R33 is connected to one end of the magnetic detection element R34 and the output port E32. The other end of each of the magnetic detection elements R32 and R34 is connected to the ground port G3. A power supply voltage of predetermined magnitude is applied to the power supply port V3. The ground port G3 is grounded. The difference detector 25 outputs to the first arithmetic circuit 31 a signal that corresponds to the potential difference between the output ports E31 and E32.

The fourth detection circuit 22 has a Wheatstone bridge circuit 26 and a difference detector 27. The Wheatstone bridge circuit 26 includes a power supply port V4, a ground port G4, two output ports E41 and E42, a first pair of magnetic detection elements R41 and R42 connected in series, and a second pair of magnetic detection elements R43 and R44 connected in series. One end of each of the magnetic detection elements R41 and R43 is connected to the power supply port V4. The other end of the magnetic detection element R41 is connected to one end of the magnetic detection element R42 and the output port E41. The other end of the magnetic detection element R43 is connected to one end of the magnetic detection element R44 and the output port E42. The other end of each of the magnetic detection elements R42 and R44 is connected to the ground port G4. A power supply voltage of predetermined magnitude is applied to the power supply port V4. The ground port G4 is grounded. The difference detector 27 outputs to the second arithmetic circuit 32 a signal that corresponds to the potential difference between the output ports E41 and E42.

In the present embodiment, all the magnetic detection elements included in the Wheatstone bridge circuits (hereinafter, referred to as bridge circuits) 14, 16, 24, and 26 are MR elements, or TMR elements in particular. GMR elements may be employed instead of the TMR elements. The TMR elements or GMR elements each have a magnetization pinned layer whose direction of magnetization is pinned, a free layer whose direction of magnetization varies according to the direction of a magnetic field applied thereto, and a nonmagnetic layer disposed between the magnetization pinned layer and the free layer. For TMR elements, the nonmagnetic layer is a tunnel barrier layer. For GMR elements, the nonmagnetic layer is a nonmagnetic conductive layer. The TMR elements or GMR elements vary in resistance depending on the angle that the direction of magnetization of the free layer forms with respect to the direction of magnetization of the magnetization pinned layer. The resistance reaches its minimum value when the foregoing angle is 0°. The resistance reaches its maximum value when the foregoing angle is 180°. In the following description, the magnetic detection elements included in the bridge circuits 14, 16, 24, and 26 will be referred to as MR elements. In FIG. 3, the filled arrows indicate the directions of magnetization of the magnetization pinned layers in the MR elements. The hollow arrows indicate the directions of magnetization of the free layers in the MR elements.

In the first detection circuit 11, the magnetization pinned layers of the MR elements R11 and R14 are magnetized in a direction parallel to the first direction, and the magnetization pinned layers of the MR elements R12 and R13 are magnetized in a direction opposite to the direction of magnetization of the magnetization pinned layers of the MR elements R11 and R14. In this case, the potential difference between the output ports E11 and E12 varies according to the intensity of the component of the first applied field in the first direction. The first direction therefore serves as a reference direction when the first detection circuit 11 detects the first applied field. The first detection circuit 11 detects the intensity of the component of the first applied field in the first direction, and outputs a signal that indicates the intensity. In the example shown in FIG. 3, the magnetization pinned layers of the MR elements R11 and R14 are magnetized in the X direction, and the magnetization pinned layers of the MR elements R12 and R13 are magnetized in the −X direction. In such an example, the first direction is the same as the X direction.

In the second detection circuit 12, the magnetization pinned layers of the MR elements R21 and R24 are magnetized in a direction parallel to the second direction, and the magnetization pinned layers of the MR elements R22 and R23 are magnetized in a direction opposite to the direction of magnetization of the magnetization pinned layers of the MR elements R21 and R24. In this case, the potential difference between the output ports E21 and E22 varies according to the intensity of the component of the first applied field in the second direction. The second direction therefore serves as a reference direction when the second detection circuit 12 detects the first applied field. The second detection circuit 12 detects the intensity of the component of the first applied field in the second direction, and outputs a signal that indicates the intensity. In the example shown in FIG. 3, the magnetization pinned layers of the MR elements R21 and R24 are magnetized in the Y direction, and the magnetization pinned layers of the MR elements R22 and R23 are magnetized in the −Y direction. In such an example, the second direction is the same as the Y direction.

In the third detection circuit 21, the magnetization pinned layers of the MR elements R31 and R34 are magnetized in a direction parallel to the third direction, and the magnetization pinned layers of the MR elements R32 and R33 are magnetized in a direction opposite to the direction of magnetization of the magnetization pinned layers of the MR elements R31 and R34. In this case, the potential difference between the output ports E31 and E32 varies according to the intensity of the component of the second applied field in the third direction. The third direction therefore serves as a reference direction when the third detection circuit 21 detects the second applied field. The third detection circuit 21 detects the intensity of the component of the second applied field in the third direction, and outputs a signal that indicates the intensity. In the example shown in FIG. 3, the magnetization pinned layers of the MR elements R31 and R34 are magnetized in the −X direction, and the magnetization pinned layers of the MR elements R32 and R33 are magnetized in the X direction. In such an example, the third direction is the same as the X direction.

In the fourth detection circuit 22, the magnetization pinned layers of the MR elements R41 and R44 are magnetized in a direction parallel to the fourth direction, and the magnetization pinned layers of the MR elements R42 and R43 are magnetized in a direction opposite to the direction of magnetization of the magnetization pinned layers of the MR elements R41 and R44. In this case, the potential difference between the output ports E41 and E42 varies according to the intensity of the component of the second applied field in the fourth direction. The fourth direction therefore serves as a reference direction when the fourth detection circuit 22 detects the second applied field. The fourth detection circuit 22 detects the intensity of the component of the second applied field in the fourth direction, and outputs a signal that indicates the intensity. In the example shown in FIG. 3, the magnetization pinned layers of the MR elements R41 and R44 are magnetized in the −Y direction, and the magnetization pinned layers of the MR elements R42 and R43 are magnetized in the Y direction. In such an example, the fourth direction is the same as the Y direction.

Figure 6:
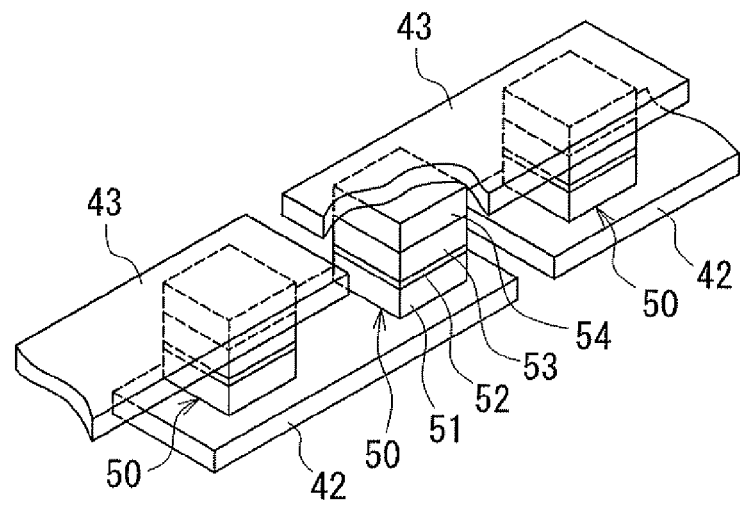
FIG. 6 is a perspective view showing part of an MR element in the rotating field sensor shown in FIG. 3.

An example of the configuration of the MR elements will now be described with reference to FIG. 6. FIG. 6 is a perspective view showing a part of an MR element in the rotating field sensor 1 shown in FIG. 3. In this example, the MR element has a plurality of lower electrodes, a plurality of MR films, and a plurality of upper electrodes. The plurality of lower electrodes 42 are arranged on a not-shown substrate. Each of the lower electrodes 42 has a long slender shape. Two lower electrodes 42 adjoining in the longitudinal direction of the lower electrodes 42 have a gap therebetween. As shown in FIG. 6, MR films 50 are provided on the top surfaces of the lower electrodes 42, near opposite ends in the longitudinal direction. Each of the MR films 50 includes a free layer 51, a nonmagnetic layer 52, a magnetization pinned layer 53, and an antiferromagnetic layer 54 that are stacked in this order, the free layer 51 being closest to the lower electrode 42. The free layer 51 is electrically connected to the lower electrode 42. The antiferromagnetic layer 54 is made of an antiferromagnetic material. The antiferromagnetic layer 54 is in exchange coupling with the magnetization pinned layer 53 so as to pin the direction of magnetization of the magnetization pinned layer 53. The plurality of upper electrodes 43 are arranged over the plurality of MR films 50. Each of the upper electrodes 43 has a long slender shape, and establishes electrical connection between the respective antiferromagnetic layers 54 of two adjoining MR films 50 that are arranged on two lower electrodes 42 adjoining in the longitudinal direction of the lower electrodes 42. With such a configuration, the plurality of MR films 50 in the MR element shown in FIG. 6 are connected in series by the plurality of lower electrodes 42 and the plurality of upper electrodes 43. It should be appreciated that the layers 51 to 54 of the MR films 50 may be stacked in an order reverse to that shown in FIG. 6.

The operation and effects of the rotating field sensor 1 will now be described with reference to FIG. 3, FIG. 4A, FIG. 4B, and FIG. 5. As previously described, the first arithmetic circuit 31 generates the first signal based on the output signals of the first and third detection circuits 11 and 21, and the second arithmetic circuit 32 generates the second signal based on the output signals of the second and fourth detection circuits 12 and 22. Based on the first signal and the second signal, the third arithmetic circuit 33 calculates the detected angle value θs that has a correspondence relationship with the angle that the direction of the rotating magnetic field in the reference position forms with respect to the reference direction.

According to the present embodiment, even if a noise field other than the rotating magnetic field is applied to the rotating field sensor 1 from outside, it is possible to reduce errors in the detected angle value θs that result from the noise field. This will be discussed in detail below. In the following description, the noise field will be denoted as noise field $H_{ext}$.

First, a description will be given of the relationship between the output signals of the first and second detection circuits 11 and 12 of the first detection unit 10 and the noise field $H_{ext}$. In the example shown in FIG. 3, the directions of magnetization of the magnetization pinned layers of the MR elements in the second detection circuit 12 are orthogonal to those of the magnetization pinned layers of the MR elements in the first detection circuit 11. In an ideal situation, the output signal of the first detection circuit 11 traces a sine waveform, and the output signal of the second detection circuit 12 traces a cosine waveform. In this case, the output signal of the second detection circuit 12 differs from that of the first detection circuit 11 in phase by ¼ the period T, i.e., by π/2(90°).

When the angle θ shown in FIG. 4A is greater than 0° and smaller than 180°, the output signal of the first detection circuit 11 has a positive value. When the angle θ shown in FIG. 4A is greater than 180° and smaller than 360°, the output signal of the first detection circuit 11 has a negative value. When the angle θ shown in FIG. 4A is equal to or greater than 0° and smaller than 90° and when the angle θ is greater than 270° and smaller than or equal to 360°, the output signal of the second detection circuit 12 has a positive value. When the angle θ is greater than 90° and smaller than 270°, the output signal of the second detection circuit 12 has a negative value. Hereinafter, the output signal of the first detection circuit 11 will be denoted by sin θ1, and the output signal of the second detection circuit 12 will be denoted by cos θ1. The output signal sin θ1 is a signal that indicates the intensity of the component of the first applied field in the first direction (the X direction). The output signal cos θ1 is a signal that indicates the intensity of the component of the first applied field in the second direction (the Y direction).

In FIG. 4A, the arrow with symbol $H_{ext}$ indicates the direction of the noise field $H_{ext}$ that is applied to the first detection unit 10. Although not shown, the noise field $H_{ext}$ includes a first component in a direction parallel to the X direction and a second component in a direction parallel to the Y direction. In the example shown in FIG. 4A, the first component of the noise field $H_{ext}$ is in the same direction as the first direction (i.e., in the X direction), and the second component of the noise field $H_{ext}$ is in the direction opposite to the second direction (i.e., in the −Y direction). When the noise field $H_{ext}$ is applied, the first applied field is a composite magnetic field resulting from a combination of the first partial magnetic field MF1 and the noise field $H_{ext}$. In such a case, the output signal sin θ1 includes a noise component of a positive value that results from the first component of the noise field $H_{ext}$, and the output signal cos θ1 includes a noise component of a negative value that results from the second component of the noise field $H_{ext}$. Using the angle θ shown in FIG. 4A, the output signals sin θ1 and cos θ1 can be expressed by the following equations (1) and (2):

$$\sin θ1 = \sin θ + Es \qquad (1)$$

$$\cos θ1 = \cos θ − Ec \qquad (2)$$

where Es is the magnitude (absolute value) of the noise component included in the output signal sin θ1, and Ec is the magnitude of the noise component included in the output signal cos θ1.

Next, the relationship between the output signals of the third and fourth detection circuits 21 and 22 of the second detection unit 20 and the noise field $H_{ext}$ will be described. In the example shown in FIG. 3, the directions of magnetization of the magnetization pinned layers of the MR elements in the fourth detection circuit 22 are orthogonal to those of the magnetization pinned layers of the MR elements in the third detection circuit 21. In an ideal situation, the output signal of the third detection circuit 21 traces a sine waveform, and the output signal of the fourth detection circuit 22 traces a cosine waveform. In this case, the output signal of the fourth detection circuit 22 differs from that of the third detection circuit 21 in phase by ¼ the period T, i.e., by π/2(90°).

When the angle θ shown in FIG. 4B is greater than 0° and smaller than 180°, the output signal of the third detection circuit 21 has a positive value. When the angle θ shown in FIG. 4B is greater than 180° and smaller than 360°, the output signal of the third detection circuit 21 has a negative value. When the angle θ shown in FIG. 4B is equal to or greater than 0° and smaller than 90° and when the angle θ is greater than 270° and smaller than or equal to 360°, the output signal of the fourth detection circuit 22 has a positive value. When the angle θ is greater than 90° and smaller than 270°, the output signal of the fourth detection circuit 22 has a negative value. Hereinafter, the output signal of the third detection circuit 21 will be denoted by sin θ2, and the output signal of the fourth detection circuit 22 will be denoted by cos θ2. The output signal sin θ2 is a signal that indicates the intensity of the component of the second applied field in the third direction (the −X direction). The output signal cos θ2 is a signal that indicates the intensity of the component of the second applied field in the fourth direction (the −Y direction).

As shown in FIG. 4B, the second detection unit 20 undergoes a noise field $H_{ext}$ whose direction and magnitude are the same as those of the noise field $H_{ext}$ that is applied to the first detection unit 10. As mentioned above, the noise field $H_{ext}$ includes a first component in a direction parallel to the X direction and a second component in a direction parallel to the Y direction. In the example shown in FIG. 4B, the first component of the noise field $H_{ext}$ is in the direction opposite to the third direction (i.e., in the X direction), and the second component of the noise field $H_{ext}$ is in the same direction as the fourth direction (i.e., in the −Y direction). When the noise field $H_{ext}$ is applied, the second applied field is a composite magnetic field resulting from a combination of the second partial magnetic field MF2 and the noise field $H_{ext}$. In such a case, the output signal sin θ2 includes a noise component of a negative value that results from the first component of the noise field $H_{ext}$, and the output signal cos θ2 includes a noise component of a positive value that results from the second component of the noise field $H_{ext}$. In principle, the noise component included in the output signal sin θ2 has the same magnitude as the magnitude Es of the noise component included in the output signal sin θ1, with an opposite sign. Similarly, in principle, the noise component included in the output signal cos θ2 has the same magnitude as the magnitude Ec of the noise component included in the output signal cos θ1, with an opposite sign. Using the angle θ shown in FIG. 4B, the output signals sin θ2 and cos θ2 can thus be expressed by the following equations (3) and (4):

$$\sin θ2 = \sin θ − Es \qquad (3)$$

$$\cos θ2 = \cos θ + Ec. \qquad (4)$$

Figure 5:
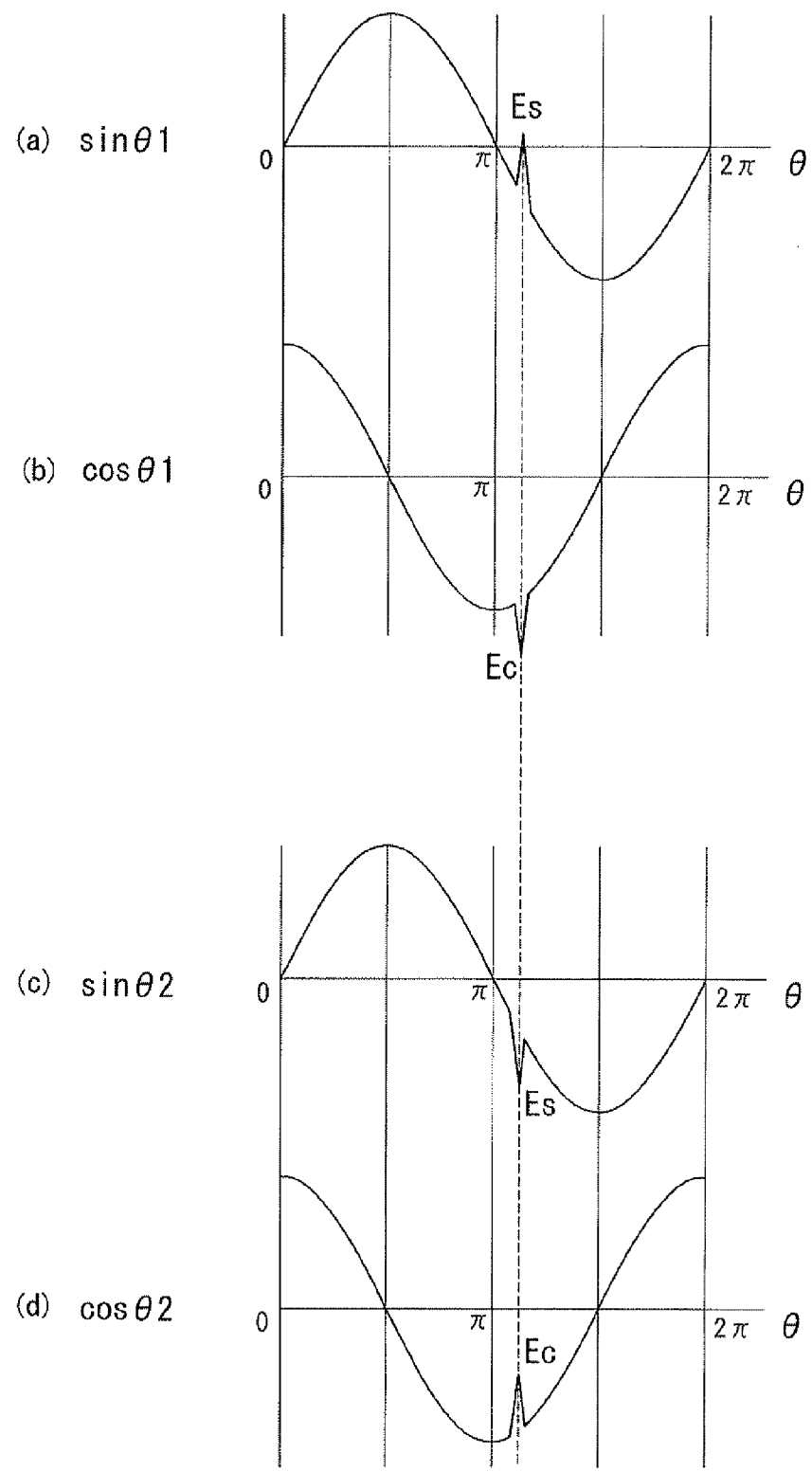
FIG. 5 is a waveform chart showing the output signals of first to fourth detection circuits of the first embodiment of the invention.

FIG. 5 is an explanatory diagram showing the waveforms of the output signals of the first to fourth detection circuits 11, 12, 21, and 22. Portions (a) to (d) of FIG. 5 show the waveforms of the output signals sin θ1, cos θ1, sin θ2, and cos θ2, respectively. In the present embodiment, the direction of the first partial magnetic field MF1 and that of the second partial magnetic field MF2 are different from each other by 180°. In the present embodiment, the first direction and the third direction are also different from each other by 180°. The output signal sin θ1 and the output signal sin θ2 therefore have the same phase. Furthermore, in the present embodiment, the second direction and the fourth direction are also different from each other by 180°. The output signal cos θ1 and the output signal cos θ2 therefore have the same phase.

FIG. 5 also shows the noise components included in the respective output signals. In the example shown in FIG. 5, the noise field $H_{ext}$ is a pulsed noise field that is applied for a time sufficiently shorter than the period T. Here, the output signal sin θ1 includes a noise component of a positive value resulting from the noise field $H_{ext}$, and the output signal sin θ2 includes a noise component of a negative value resulting from the noise field $H_{ext}$. The output signal cos θ1 includes a noise component of a negative value resulting from the noise field $H_{ext}$, and the output signal cos θ2 includes a noise component of a positive value resulting from the noise field $H_{ext}$. As can be seen from the equations (1) and (3) and FIG. 5, the noise component included in the output signal sin θ1 has a positive value (Es) and the noise component included in the output signal sin θ2 has a negative value (−Es). As can be seen from the equations (2) and (4) and FIG. 5, the noise component included in the output signal cos θ1 has a negative value (−Ec) and the noise component included in the output signal cos θ2 has a positive value (Ec).

A description will now be given of the method by which the first arithmetic circuit 31 generates the first signal and the relationship between the first signal and the noise field $H_{ext}$. Based on the output signal sin θ1 of the first detection circuit 11 and the output signal sin θ2 of the third detection circuit 21, the first arithmetic circuit 31 generates the first signal sin θs that has a correspondence relationship with both the intensity of the component of the first applied field in the first direction and the intensity of the component of the second applied field in the third direction. For example, the output signal sin θ1 and the output signal sin θ2 can be averaged into the first signal sin θs. In this case, using the equations (1) and (3), the first signal sin θs is given by the following equation (5):

$$\sin\theta s = (\sin\theta 1 + \sin\theta 2)/2 \quad (5)$$
$$= (\sin\theta + Es + \sin\theta - Es)/2$$
$$= \sin\theta.$$

From the equation (5), it is shown that the first signal sin θs is equal to sin θ. As can be seen from the equations (1), (3), and (5), since the noise component included in the output signal sin θ1 and that included in the output signal sin θ2 have a value with opposite signs, the noise component included in the output signal sin θ1 and that included in the output signal sin θ2 cancel each other out when the first arithmetic circuit 31 generates the first signal sin θs. As is clear from the equations (1) and (3), the output signal sin θ1 indicating the intensity of the component of the first applied field in the first direction and the output signal sin θ2 indicating the intensity of the second applied field in the third direction both include sin θ. The first signal sin θs therefore has a correspondence relationship with both the intensity of the component of the first applied field in the first direction and the intensity of the component of the second applied field in the third direction.

It should be appreciated that while the output signal sin θ1 and the output signal sin θ2 are averaged in the equation (5), the output signal sin θ1 and the output signal sin θ2 may be added into the first signal sin θs. In this case also, the noise component included in the output signal sin θ1 and that included in the output signal sin θ2 cancel each other out.

Next, the method by which the second arithmetic circuit 32 generates the second signal and the relationship between the second signal and the noise field $H_{ext}$ will be described. Based on the output signal cos θ1 of the second detection circuit 12 and the output signal cos θ2 of the fourth detection circuit 22, the second arithmetic circuit 32 generates the second signal cos θs that has a correspondence relationship with both the intensity of the component of the first applied field in the second direction and the intensity of the component of the second applied field in the fourth direction. For example, the output signal cos θ1 and the output signal cos θ2 can be averaged into the second signal cos θs. In this case, using the equations (2) and (4), the second signal cos θs is given by the following equation (6):

$$\cos\theta s = (\cos\theta 1 + \cos\theta 2)/2 \quad (6)$$
$$= (\cos\theta - Ec + \cos\theta + Ec)/2$$
$$= \cos\theta.$$

From the equation (6), it is shown that the second signal cos θs is equal to cos θ. As can be seen from the equations (2), (4), and (6), since the noise component included in the output signal cos θ1 and that included in the output signal cos θ2 have a value with opposite signs, the noise component included in the output signal cos θ1 and that included in the output signal cos θ2 cancel each other out when the second arithmetic circuit 32 generates the second signal cos θs. As is clear from the equations (2) and (4), the output signal cos θ1 indicating the intensity of the component of the first applied field in the second direction and the output signal cos θ2 indicating the intensity of the second applied field in the fourth direction both include cos θ. The second signal cos θs therefore has a correspondence relationship with both the intensity of the component of the first applied field in the second direction and the intensity of the component of the second applied field in the fourth direction.

As with the first signal sin θs, the output signal cos θ1 and the output signal cos θ2 may be added into the second signal cos θs. In this case also, the noise component included in the output signal cos θ1 and that included in the output signal cos θ2 cancel each other out.

Next, the method by which the third arithmetic circuit 33 calculates the detected angle value θs and the relationship between the detected angle value θs and the noise field $H_{ext}$ will be described. Based on the first signal sin θs and the second signal cos θs, the third arithmetic circuit 33 calculates the detected angle value θs that has a correspondence relationship with the angle that the direction of the rotating magnetic field in the reference position forms with respect to the reference direction. Specifically, for example, the third arithmetic circuit 33 calculates θs by the following equation (7):

$$\theta s = a\tan(\sin\theta s/\cos\theta s) \quad (7)$$
$$= a\tan(\sin\theta/\cos\theta)$$
$$= \theta,$$

where "a tan" represents an arctangent.

Within the range of 360°, θ in the equation (7) has two solutions with a difference of 180° in value. Which of the two solutions of θ in the equation (7) is the true solution to θ can be determined from the combination of positive and negative signs on sin θ and cos θ. More specifically, if sin θ is positive in value, θ is greater than 0° and smaller than 180°. If sin θ is negative in value, θ is greater than 180° and smaller than 360°. If cos θ is positive in value, θ is equal to or greater than 0° and smaller than 90°, or is greater than 270° and smaller than or equal to 360°. If cos θ is negative in value, θ is greater than 90° and smaller than 270°. The third arithmetic circuit 33 determines θ in the range of 360°, based on the equation (7) and the foregoing determination of the combination of positive and negative signs on sin θ and cos θ.

From the equation (7), it is shown that the detected angle value θs is equal to the angle θ. As mentioned previously, the noise components included in the respective output signals sin θ1 and sin θ2 cancel each other out when the first signal sin θs is generated, and the noise components included in the respective output signals cos θ1 and cos θ2 cancel each other out when the second signal cos θs is generated. Consequently, it is possible for the third arithmetic circuit 33 to calculate θs by using the first signal sin θs containing no noise component and the second signal cos θs containing no noise component.

If the direction of the noise field $H_{ext}$ is opposite to that in the case of FIG. 4A and FIG. 4B, the direction of the first component of the noise field $H_{ext}$ coincides with the −X direction, and the direction of the second component of the noise field $H_{ext}$ coincides with the Y direction. That is, in such a case, the noise component included in the output signal sin θ1 has a negative value, the noise component included in the output signal sin θ2 has a positive value, the noise component included in the output signal cos θ1 has a positive value, and the noise component included in the output signal cos θ2 has a negative value. In this case also, the noise components included in the respective output signals sin θ1 and sin θ2 cancel each other out when the first signal sin θs is generated, and the noise components included in the respective output signals cos θ1 and cos θ2 cancel each other out when the second signal cos θs is generated.

If the rotating field sensor has only one of the first detection unit 10 and the second detection unit 20, the detected angle value θs is calculated based on two output signals containing noise components. According to the present embodiment, in all situations including the foregoing example except where the noise components are zero in magnitude, the noise components included in the respective output signals sin θ1 and sin θ2 have a value with opposite signs, and the noise components included in the respective output signals cos θ1 and cos θ2 have a value with opposite signs. Therefore, as described above, the noise components included in the respective output signals sin θ1 and sin θ2 cancel each other out when the first signal sin θs is generated, and the noise components included in the respective output signals cos θ1 and cos θ2 cancel each other out when the second signal cos θs is generated. Then, the first signal sin θs containing no noise component and the second signal cos θs containing no noise component are used to calculate the detected angle value θs. Consequently, according to the present embodiment, it is possible to reduce errors in the detected angle resulting from the noise field $H_{ext}$.

The foregoing description has dealt with the case where the phase of the output signal cos θ1 is different from that of the output signal sin θ1 by ¼ the period T, the phase of the output signal sin θ2 is the same as that of the output signal sin θ1, and the phase of the output signal cos θ2 is different from that of the output signal sin θ2 by ¼ the period T. Nevertheless, the phase of the output signal cos θ1 may be different from that of the output signal sin θ1 by an odd number of times ¼ the period T, the phase of the output signal sin θ2 may be different from that of the output signal sin θ1 by an integer multiple of ½ the period T, and the phase of the output signal cos θ2 may be different from that of the output signal sin θ2 by an odd number of times ¼ the period T. In such a case, it is possible that the noise components included in the respective output signals sin θ1 and sin θ2 cancel each other out when the first signal sin θs is generated, and the noise components included in the respective output signals cos θ1 and cos θ2 cancel each other out when the second signal cos θs is generated.

The foregoing description is predicated on that the noise component included in the output signal sin θ1 and that included in the output signal sin θ2 have the same magnitude. However, the noise components may be different in magnitude. In such a case also, the value of the noise component included in the output signal sin θ1 and the value of the noise component included in the output signal sin θ2 are of opposite sign. Therefore, when calculating the first signal sin θs using the equation (5), the noise components included in the respective output signals sin θ1 and sin θ2 cancel each other out. This makes the magnitude of the noise component included in the first signal sin θs smaller than the average of the magnitudes of the noise components included in the output signals sin θ1 and sin θ2. Since the noise component included in the first signal sin θs has a smaller magnitude as described above, it is possible to reduce errors in the detected angle that result from the noise field $H_{ext}$. Similarly, the noise component included in the output signal cos θ1 and that included in the output signal cos θ2 may be different in magnitude. In this case also, the noise component included in the second signal cos θs has a smaller magnitude than the average of the magnitudes of the noise components included in the output signals cos θ1 and cos θ2, and it is thus possible to reduce errors in the detected angle that result from the noise field $H_{ext}$.

The present embodiment has dealt with the case where the noise field $H_{ext}$ is a pulsed noise field. However, the noise field $H_{ext}$ may be one that makes no change in magnitude or direction with time, or may be one that varies periodically in magnitude and direction. In such cases also, it is possible to cancel out the noise components resulting from the noise field $H_{ext}$.

In the present embodiment, the first detection unit 10 including the first and second detection circuits 11 and 12 is located in the first position, and the second detection unit 20 including the third and fourth detection circuits 21 and 22 is located in the second position. This allows reducing the installation locations of the first to fourth detection circuits 11, 12, 21, and 22 as compared to a case where the first to fourth detection circuits 11, 12, 21, and 22 are installed in respective different positions. Each of the first to fourth detection circuits 11, 12, 21, and 22 includes at least one MR element. According to the present embodiment, since the installation locations of the first to fourth detection circuits 11, 12, 21, and 22 are reduced as mentioned above, the installation locations of the MR elements included in the detection circuits 11, 12, 21, and 22 are also reduced. Consequently, the present embodiment makes it possible to reduce the installation locations of the magnetic detection elements (MR elements) while reducing errors in the detected angle resulting from the noise field $H_{ext}$.

Modification Examples

Figure 7:
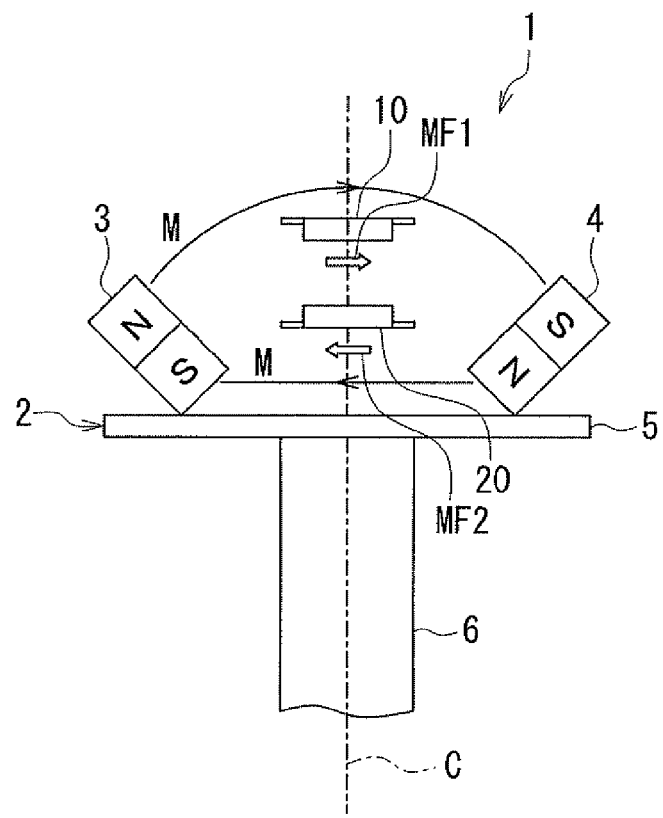
FIG. 7 is a side view showing the general configuration of a rotating field sensor of a first modification example of the first embodiment of the invention.

First and second modification examples of the present embodiment will now be described. First, a description will be given of a rotating field sensor 1 of the first modification example of the embodiment with reference to FIG. 7. FIG. 7 is a side view showing the general configuration of the rotating field sensor 1 of the first modification example. In the first modification example, the pair of magnets 3 and 4 are tilted with respect to the center of rotation C so that the distance between the magnets 3 and 4 increases with increasing distance from the top surface of the disc part 5. The N and S poles of the magnet 3 are arranged obliquely to the center of rotation C, in the order of the S pole and the N pole in the direction away from the top surface of the disc part 5. The N and S poles of the magnet 4 are arranged obliquely to the center of rotation C, in the order of the N pole and the S pole in the direction away from the top surface of the disc part 5.

In FIG. 7, the major portion of the magnetic flux from the N pole of the magnet 3 to the S pole of the magnet 4 and the major portion of the magnetic flux from the N pole of the magnet 4 to the S pole of the magnet 3 are shown by the curve and the straight line each designated by symbol M. The major portions of these magnetic fluxes are shifted upward in FIG. 7 as compared with the case where the pair of magnets 3 and 4 are not tilted with respect to the center of rotation C (FIG. 2). If the pair of magnets 3 and 4 are not tilted with respect to the center of rotation C, as shown in FIG. 2, the major portion of the magnetic flux from the N pole of the magnet 4 to the S pole of the magnet 3 may pass below the top surface of the disc unit 5. In such a case, it is sometimes difficult to locate the second detection unit 20 in an optimum position, i.e., the position where the major portion of the magnetic flux from the N pole of the magnet 4 to the S pole of the magnet 3 passes. In contrast, according to the first modification example, it is possible to adjust the distribution of the magnetic fluxes so that the major portion of the magnetic flux from the N pole of the magnet 4 to the S pole of the magnet 3 passes above the top surface of the disc part 5. This facilitates installing the second detection unit 20 in an optimum position.

In the example shown in FIG. 7, the first partial magnetic field MF1 and the second partial magnetic field MF2 may have different intensities. In such a case, a correcting calculation is preferably performed in consideration of the intensities of the first partial magnetic field MF1 and the second partial magnetic field MF2. Specifically, for example, either one of the output signals sin θ1 and sin θ2 is multiplied by a predetermined coefficient to create a pair of corrected output signals such that the corrected output signals have the same magnitude with no noise component contained in the output signals sin θ1 and sin θ2. The pair of corrected output signals is then used to generate the first signal sin θs. Similarly, either one of the output signals cos θ1 and cos θ2 is multiplied by a predetermined coefficient to create a pair of corrected output signals such that the corrected output signals have the same magnitude with no noise component contained in the output signals cos θ1 and cos θ2. The pair of corrected output signals is then used to generate the second signal cos θs.

Figure 8:
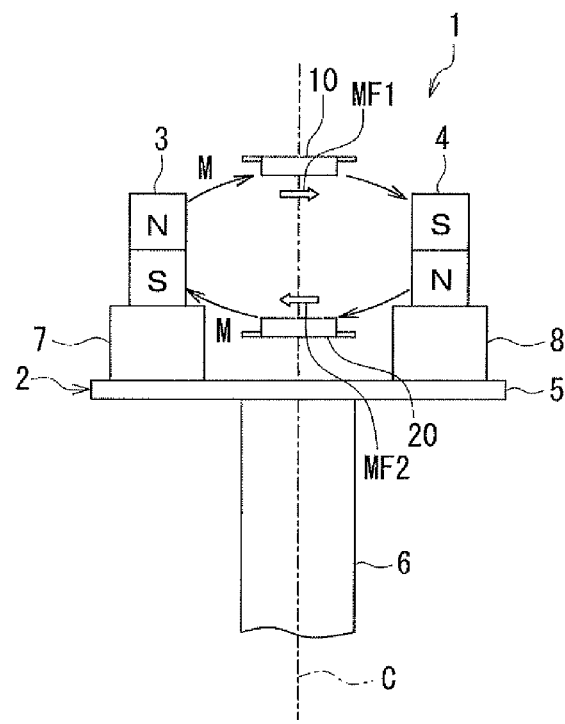
FIG. 8 is a side view showing the general configuration of a rotating field sensor of a second modification example of the first embodiment of the invention.

Reference is now made to FIG. 8 to describe a rotating field sensor 1 of the second modification example of the present embodiment. FIG. 8 is a side view showing the general configuration of the rotating field sensor 1 of the second modification example. In the second modification example, the pair of magnets 3 and 4 are located away from the top surface of the disc part 5. In addition to the components of the field generation unit 2 of the embodiment shown in FIG. 1 and FIG. 2, the field generation unit 2 of this modification example includes supporters 7 and 8 secured to the top surface of the disc part 5. The magnets 3 and 4 are fixed on the supporters 7 and 8, respectively.

In FIG. 8, the major portion of the magnetic flux from the N pole of the magnet 3 to the S pole of the magnet 4 and the major portion of the magnetic flux from the N pole of the magnet 4 to the S pole of the magnet 3 are shown by the curves designated by symbol M. These major portions of the magnetic fluxes are shifted upward in FIG. 8 as compared with the case where the magnets 3 and 4 are fixed to the top surface of the disc part 5 (FIG. 2). Consequently, according to the second modification example, it is possible to install the second detection unit 20 in an optimum position easily, as with the first modification example. Moreover, the second modification example allows preventing the occurrence of a difference in intensity between the first partial magnetic field MF1 and the second partial magnetic field MF2. This eliminates the need for the foregoing correcting calculation.

Second Embodiment

Figure 9:
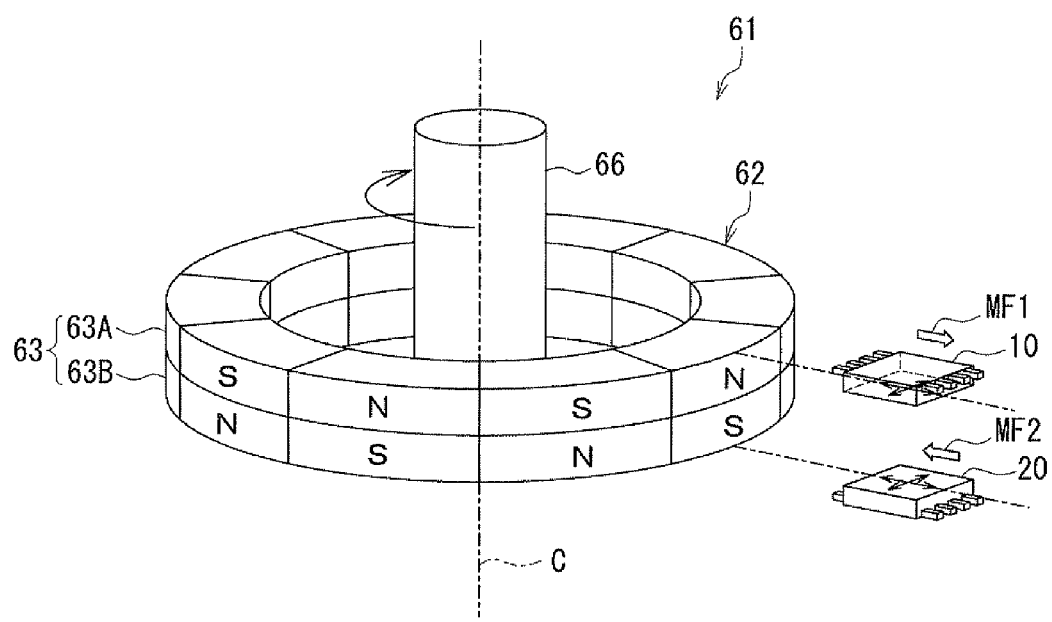
FIG. 9 is a perspective view showing the general configuration of a rotating field sensor according to a second embodiment of the invention.
Figure 10:
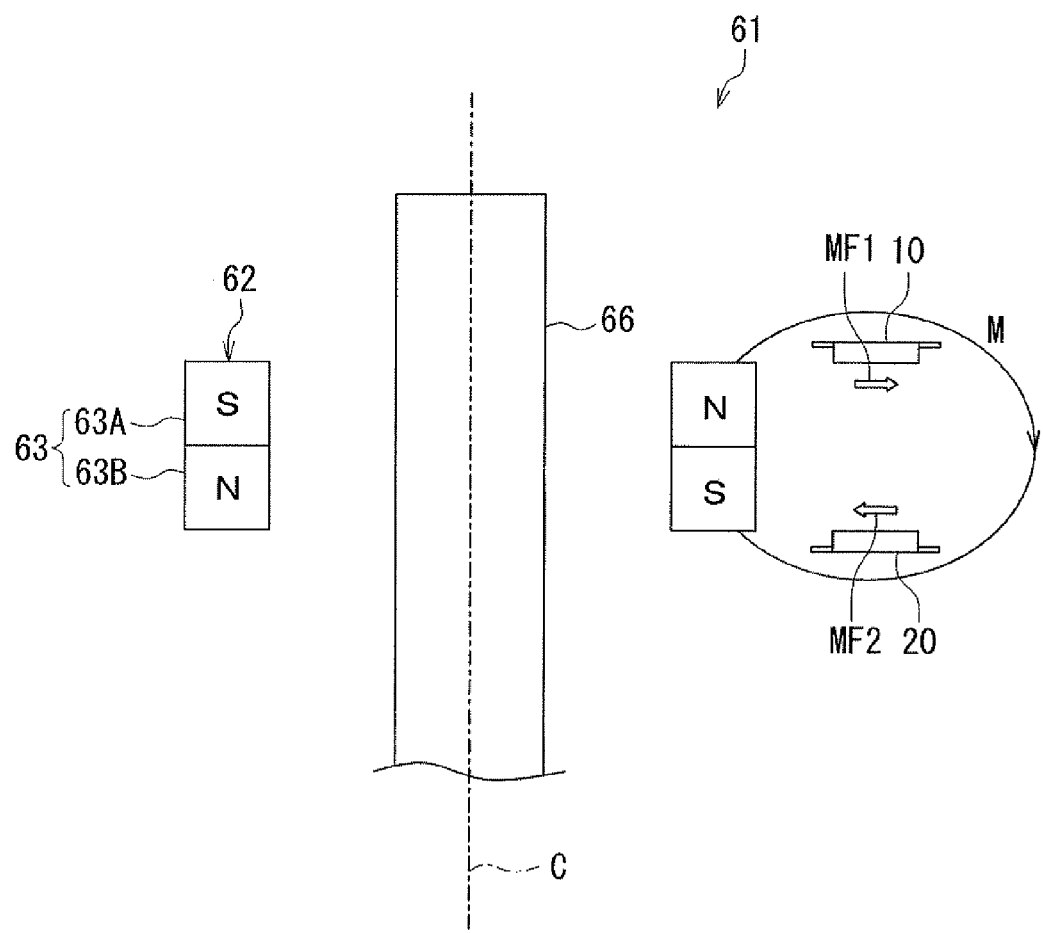
FIG. 10 is a side view showing the general configuration of the rotating field sensor according to the second embodiment of the invention.

A rotating field sensor according to a second embodiment of the invention will now be described with reference to FIG. 9 and FIG. 10. FIG. 9 is a perspective view showing the general configuration of the rotating field sensor according to the present embodiment. FIG. 10 is a side view showing the general configuration of the rotating field sensor according to the present embodiment. As shown in FIG. 9 and FIG. 10, the rotating field sensor 61 according to the present embodiment has a field generation unit 62 instead of the field generation unit 2 of the first embodiment.

The field generation unit 62 has a ring-shaped magnet 63. The magnet 63 is attached to a rotating shaft 66 which is the object whose rotational position is to be detected. In FIG. 9 and FIG. 10, the dot-and-dash line designated by symbol C shows the center of rotation including the center axis of the rotating shaft 66. The magnet 63 is fixed to the rotating shaft 66 by not-shown fixing means so as to be symmetrical about the center of rotation C. The magnet 63 rotates about the center of rotation C along with the rotating shaft 66. As a result, a rotating magnetic field occurs based on the magnetic field generated by the magnet 63.

The magnet 63 includes a first layer 63A and a second layer 63B. In each of the first and second layers 63A and 63B, one or more pairs of N and S poles are alternately arranged in a ring shape. The first layer 63A and the second layer 63B are stacked in the vertical direction (the direction parallel to the center of rotation C) in FIG. 9 and FIG. 10. The N poles of the first layer 63A are arranged to be vertically adjacent to the S poles of the second layer 63B. The S poles of the first layer 63A are arranged to be vertically adjacent to the N poles of the second layer 63B.

As shown in FIG. 9 and FIG. 10, the first and second detection units 10 and 20 are located outside the outer periphery of the magnet 63 and arranged in the direction parallel to the center of rotation C. The position where the first detection unit 10 is located is the first position. The position where the second detection unit 20 is located is the second position. The first position lies above a virtual plane that includes the interface between the first layer 63A and the second layer 63B. The second position is below the virtual plane. The rotating magnetic field includes a first partial magnetic field MF1 in the first position and a second partial magnetic field MF2 in the second position. Magnetic fluxes in the vicinity of the first layer 63A produce most of the first partial magnetic field MF1. The magnetic fluxes in the vicinity of the first layer 63A include a magnetic flux between two different poles of the first and second layers 63A and 63B that are vertically adjacent to each other, and a magnetic flux between two different poles of the first layer 63A that are adjacent to each other in the direction of rotation. Magnetic fluxes in the vicinity of the second layer 63B produce most of the second partial magnetic field MF2. The magnetic fluxes in the vicinity of the second layer 6313 include a magnetic flux between two different poles of the first and second layers 63A and 63B that are vertically adjacent to each other, and a magnetic flux between two different poles of the second layer 63B that are adjacent to each other in the direction of rotation. In FIG. 10, the major portion of the magnetic flux from an N pole of the first layer 63A to an S pole of the second layer 63B is shown by the curve designated by symbol M. The first partial magnetic field MF1 and the second partial magnetic field MF2 differ in direction by 180° and rotate in the same direction of rotation.

The first detection unit 10 detects a first applied field in the first position. The first applied field includes the first partial magnetic field MF1 as its main component. The second detection unit 20 detects a second applied field in the second position. The second applied field includes the second partial magnetic field MF2 as its main component. A first direction serving as the reference direction for one component of the first applied field and a third direction serving as the reference direction for one component of the second applied field are different from each other by 180°. A second direction serving as the reference direction for another component of the first applied field and a fourth direction serving as the reference direction for another component of the second applied field are different from each other by 180°.

In the example shown in FIG. 9, each of the first layer 63A and the second layer 63B includes five pairs of N and S poles. One rotation of the magnet 63 produces five rotations of the first partial magnetic field MF1 and the second partial magnetic field MF2. In this case, one period of the output signals of the detection circuits 11, 12, 21, and 22, i.e., an electrical angle of 360°, is equivalent to a one-fifth rotation of the magnet 63, i.e., an angle of rotation of 72° of the magnet 63.

Modification Example

Figure 11:
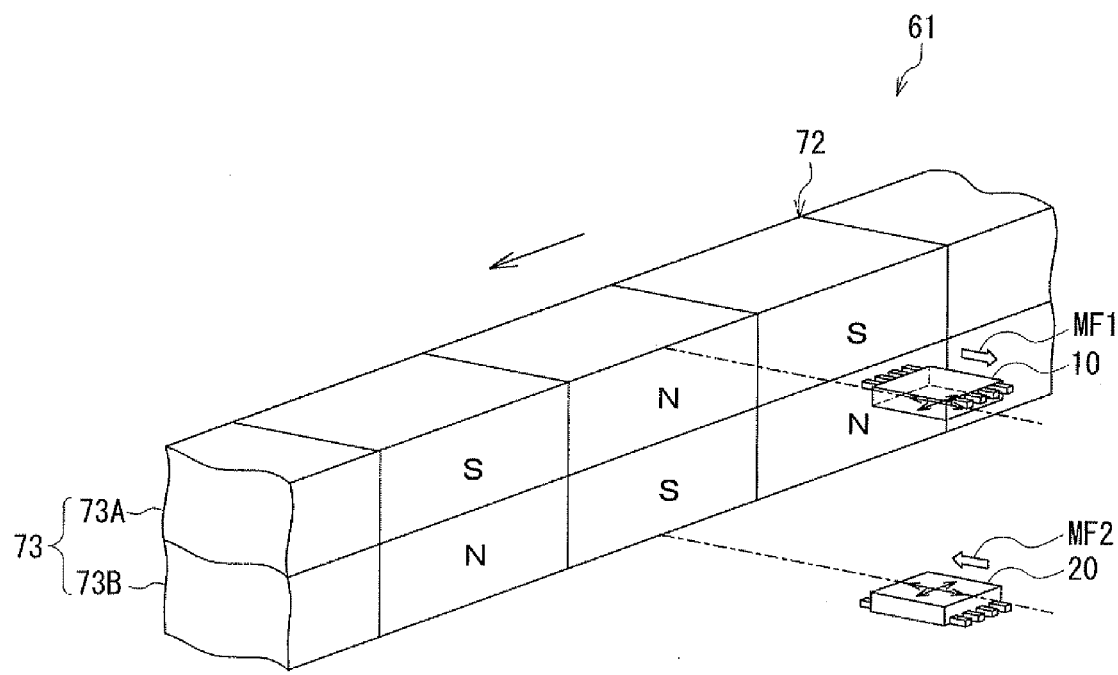
FIG. 11 is a perspective view showing the general configuration of a rotating field sensor of a modification example of the second embodiment of the invention.

A modification example of the present embodiment will now be described with reference to FIG. 11. FIG. 11 is a side view showing the general configuration of a rotating field sensor 61 of the modification example of the present embodiment. As shown in FIG. 11, the rotating field sensor 61 of the modification example has a field generation unit 72 instead of the field generation unit 62.

The field generation unit 72 includes a magnet 73 that is long in one direction. The magnet 73 makes a straight movement in its longitudinal direction along with a straight movement of the object. As a result, a rotating magnetic field occurs based on the magnetic field generated by the magnet 73. The magnet 73 includes a first layer 73A and a second layer 73B each of which has a plurality of pairs of N and S poles alternately arranged in a line. The first layer 73A and the second layer 73B are stacked in the vertical direction in FIG. 11 (the direction orthogonal to the direction of movement of the magnet 73). The N poles of the first layer 73A are arranged to be vertically adjacent to the S poles of the second layer 73B. The S poles of the first layer 73A are arranged to be vertically adjacent to the N poles of the second layer 73B.

As shown in FIG. 11, the first and second detection units 10 and 20 are located beside the magnet 73 and arranged in the vertical direction in FIG. 11 (the stacking direction of the first layer 73A and the second layer 73B). The position where the first detection unit 10 is located is the first position. The position where the second detection unit 20 is located is the second position. The first position lies above a virtual plane that includes the interface between the first layer 73A and the second layer 73B. The second position is below the virtual plane. The rotating magnetic field includes a first partial magnetic field MF1 in the first position and a second partial magnetic field MF2 in the second position. Magnetic fluxes in the vicinity of the first layer 73A produce most of the first partial magnetic field MF1. The magnetic fluxes in the vicinity of the first layer 73A include a magnetic flux between two different poles of the first and second layers 73A and 73B that are vertically adjacent to each other, and a magnetic flux between two different poles of the first layer 73A that are adjacent to each other in the direction of movement of the magnet 73. Magnetic fluxes in the vicinity of the second layer 73B produce most of the second partial magnetic field MF2. The magnetic fluxes in the vicinity of the second layer 73B include a magnetic flux between two different poles of the first and second layers 73A and 73B that are vertically adjacent to each other, and a magnetic flux between two different poles of the second layer 73B that are adjacent to each other in the direction of movement of the magnet 73. The first partial magnetic field MF1 and the second partial magnetic field MF2 differ in direction by 180° and rotate in the same direction of rotation.

The first detection unit 10 detects a first applied field in the first position. The first applied field includes the first partial magnetic field MF1 as its main component. The second detection unit 20 detects a second applied field in the second position. The second applied field includes the second partial magnetic field MF2 as its main component. A first direction serving as the reference direction for one component of the first applied field and a third direction serving as the reference direction for one component of the second applied field are different from each other by 180°. A second direction serving as the reference direction for another component of the first applied field and a fourth direction serving as the reference direction for another component of the second applied field are different from each other by 180°.

While the magnet 73 moves by one pitch, i.e., as much as a pair of N and S poles, each of the first partial magnetic field MF1 and the second partial magnetic pole MF2 makes one rotation. In this case, one period of the output signals of the detection circuits 11, 12, 21, and 22, i.e., an electrical angle of 360°, is equivalent to one pitch of the magnet 73.

The other configuration, operation, and effects of the present embodiment are the same as those of the first embodiment.

Third Embodiment

Figure 12:
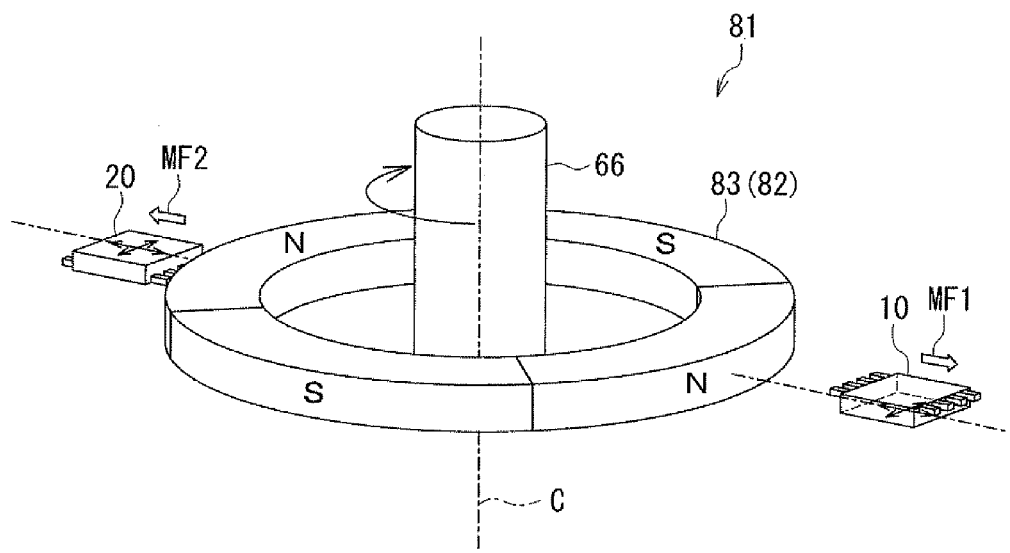
FIG. 12 is a perspective view showing the general configuration of a rotating field sensor according to a third embodiment of the invention.

A rotating field sensor according to a third embodiment of the invention will now be described with reference to FIG. 12. FIG. 12 is a perspective view showing the general configuration of the rotating field sensor according to the present embodiment. As shown in FIG. 12, the rotating field sensor 81 according to the present embodiment has a field generation unit 82 instead of the field generation unit 62 of the second embodiment.

The field generation unit 82 has a ring-shaped magnet 83. The magnet 83 is attached to a rotating shaft 66 which is the object whose rotational position is to be detected. In FIG. 12, the dot-and-dash line designated by symbol C shows the center of rotation including the center axis of the rotating shaft 66. The magnet 83 is fixed to the rotating shaft 66 by not-shown fixing means so as to be symmetrical about the center of rotation C. The magnet 83 rotates about the center of rotation C along with the rotating shaft 66. As a result, a rotating magnetic field occurs based on the magnetic field generated by the magnet 83. The magnet 83 is composed of 2n pairs (n is an integer equal to or greater than 1) of N and S poles that are alternately arranged in a ring shape. In the example shown in FIG. 12, the magnet 83 includes two pairs of N and S poles.

As shown in FIG. 12, the first and second detection units 10 and 20 are arranged with the magnet 83 therebetween, in symmetrical positions with respect to a virtual plane that includes the center of rotation C. The position where the first detection unit 10 is located is the first position. The position where the second detection unit 20 is located is the second position. The rotating magnetic field includes a first partial magnetic field MF1 in the first position and a second partial magnetic field MF2 in the second position. The first partial magnetic field MF1 and the second partial magnetic field MF2 differ in direction by 180° and rotate in the same direction of rotation.

The first detection unit 10 detects a first applied field in the first position. The first applied field includes the first partial magnetic field MF1 as its main component. The second detection unit 20 detects a second applied field in the second position. The second applied field includes the second partial magnetic field MF2 as its main component. A first direction serving as the reference direction for one component of the first applied field and a third direction serving as the reference direction for one component of the second applied field are different from each other by 180°. A second direction serving as the reference direction for another component of the first applied field and a fourth direction serving as the reference direction for another component of the second applied field are different from each other by 180°.

In the example shown in FIG. 12, one rotation of the magnet 83 produces two rotations of the first partial magnetic field MF1 and the second partial magnetic field MF2. In this case, one period of the output signals of the detection circuits 11, 12, 21, and 22, i.e., an electrical angle of 360°, is equivalent to a one-half rotation of the magnet 83, i.e., an angle of rotation of 180° of the magnet 83.

Modification Example

Figure 13:
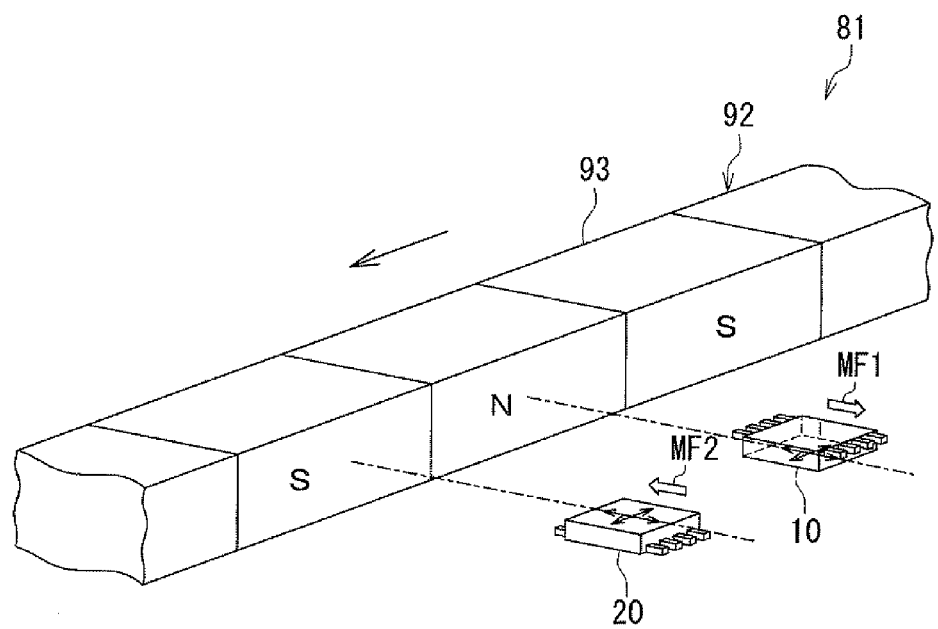
FIG. 13 is a perspective view showing the general configuration of a rotating field sensor of a modification example of the third embodiment of the invention.

A modification example of the present embodiment will now be described with reference to FIG. 13. FIG. 13 is a side view showing the general configuration of a rotating field sensor 81 of the modification example of the present embodiment. As shown in FIG. 13, the rotating field sensor 81 of the modification example has a field generation unit 92 instead of the field generation unit 82.

The field generation unit 92 includes a magnet 93 that is long in one direction. The magnet 93 makes a straight movement in its longitudinal direction along with a straight movement of the object. As a result, a rotating magnetic field occurs based on the magnetic field generated by the magnet 93. The magnet 93 is composed of a plurality of pairs of N and S poles that are alternately arranged in a line.

As shown in FIG. 13, the first and second detection units 10 and 20 are located beside the magnet 93 and arranged in a direction parallel to the direction of movement of the magnet 93. The second detection unit 20 is located in a position offset from the position of the first detection unit 10 by one half pitch of the magnet 93. The position where the first detection unit 10 is located is the first position. The position where the second detection unit 20 is located is the second position. The rotating magnetic field includes a first partial magnetic field MF1 in the first position and a second partial magnetic field MF2 in the second position. The first partial magnetic field MF1 and the second partial magnetic field MF2 differ in direction by 180° and rotate in the same direction of rotation.

The first detection unit 10 detects a first applied field in the first position. The first applied field includes the first partial magnetic field MF1 as its main component. The second detection unit 20 detects a second applied field in the second position. The second applied field includes the second partial magnetic field MF2 as its main component. A first direction serving as the reference direction for one component of the first applied field and a third direction serving as the reference direction for one component of the second applied field are different from each other by 180°. A second direction serving as the reference direction for another component of the first applied field and a fourth direction serving as the reference direction for another component of the second applied field are different from each other by 180°.

While the magnet 93 moves by one pitch, each of the first partial magnetic field MF1 and the second partial magnetic pole MF2 makes one rotation. In this case, one period of the output signals of the detection circuits 11, 12, 21, and 22, i.e., an electrical angle of 360°, is equivalent to one pitch of the magnet 93.

The other configuration, operation, and effects of the present embodiment are the same as those of the second embodiment.

Fourth Embodiment

Figure 14:
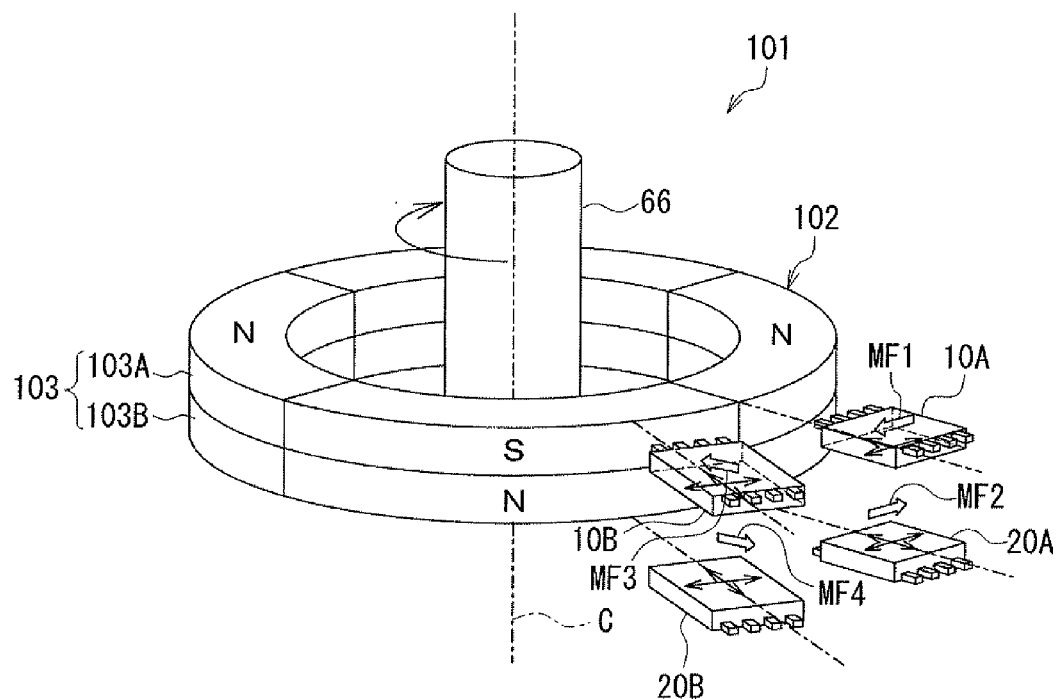
FIG. 14 is a perspective view showing the general configuration of a rotating field sensor according to a fourth embodiment of the invention.
Figure 15:
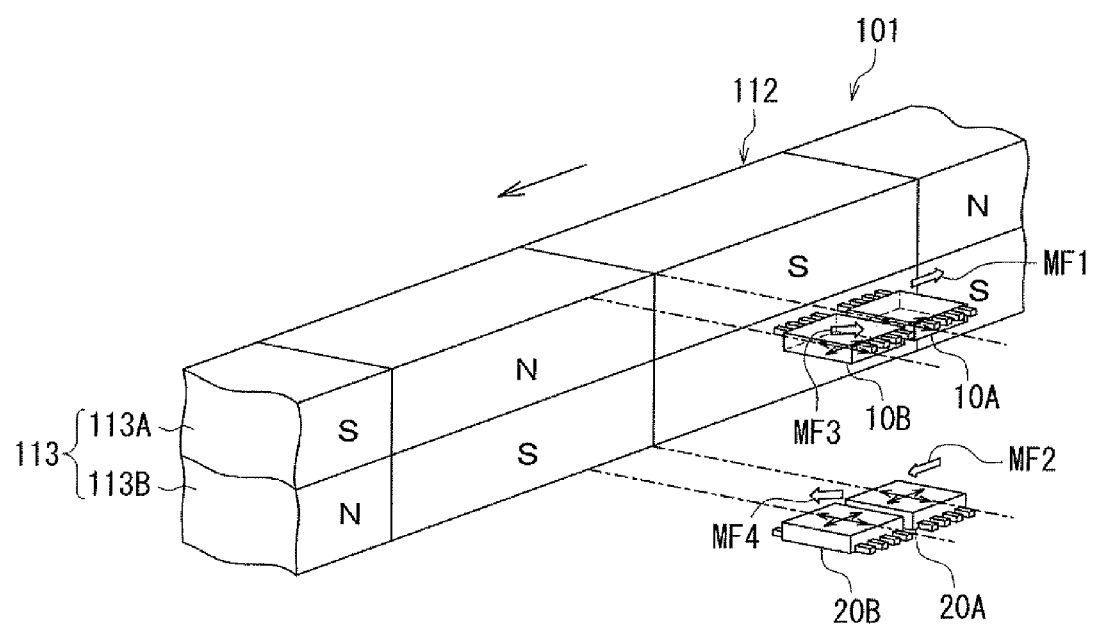
FIG. 15 is a perspective view showing the general configuration of a rotating field sensor of a modification example of the fourth embodiment of the invention.
Figure 16:
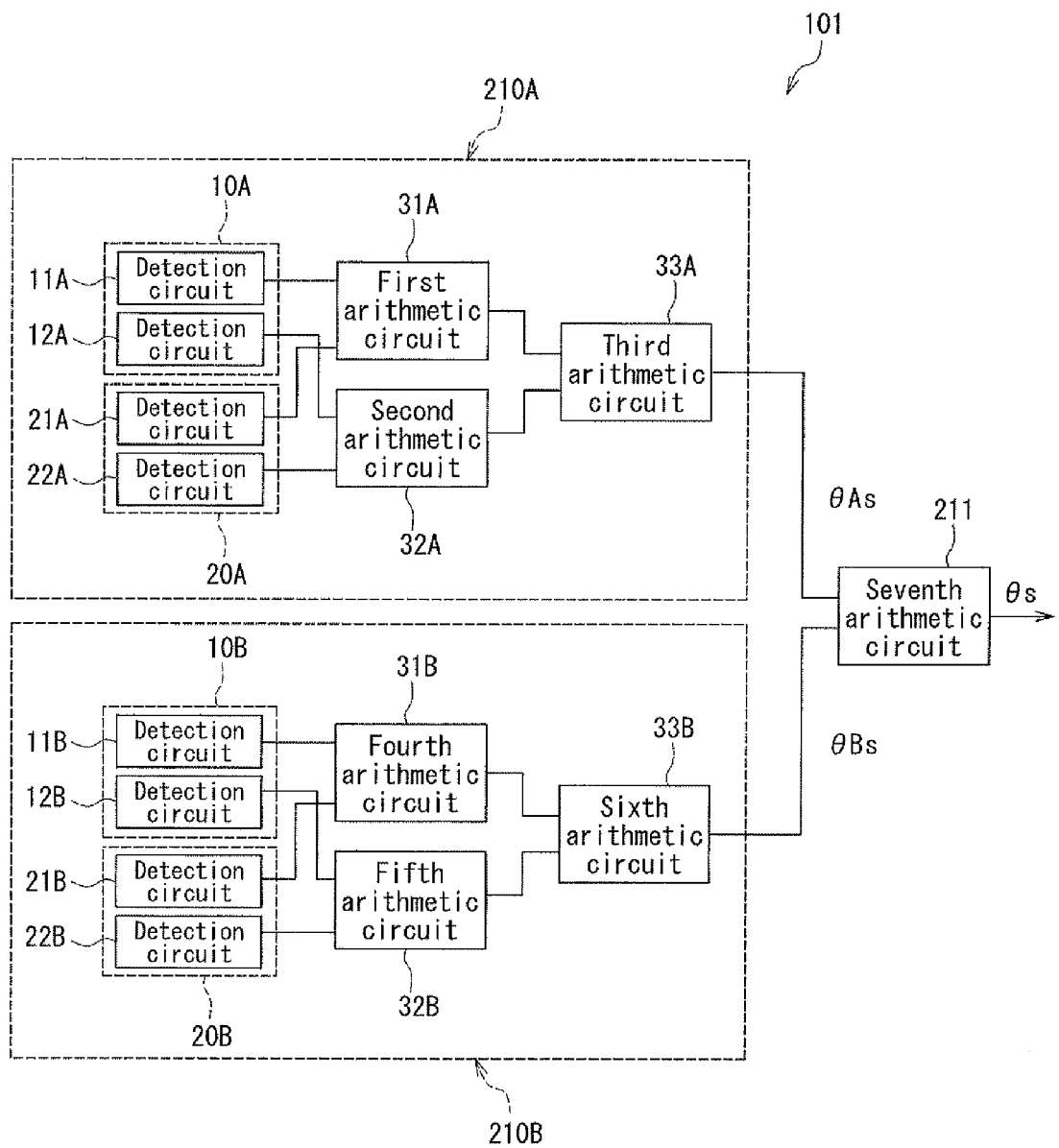
FIG. 16 is a block diagram showing the configuration of the rotating field sensor according to the fourth embodiment of the invention.

A rotating field sensor according to a fourth embodiment of the invention will now be described with reference to FIG. 14 to FIG. 16. FIG. 14 is a perspective view showing the general configuration of the rotating field sensor according to the present embodiment. FIG. 15 is a perspective view showing the general configuration of a rotating field sensor of a modification example of the present embodiment. FIG. 16 is a block diagram showing the configuration of the rotating field sensor according to the present embodiment. First, a description will be given of the configuration of the rotating field sensor 101 according to the present embodiment. As shown in FIG. 16, the rotating field sensor 101 has first and second composite detection units 210A and 210B.

Each of the composite detection units 210A and 210B has the same configuration as that of the rotating field sensor 1 of the first embodiment without the field generation unit 2. Specifically, the first composite detection unit 210A includes a first detection unit 10A, a second detection unit 20A, a first arithmetic circuit 31A, a second arithmetic circuit 32A, and a third arithmetic circuit 33A that are the same in configuration as the first detection unit 10, the second detection unit 20, the first arithmetic circuit 31, the second arithmetic circuit 32, and the third arithmetic circuit 33, respectively. Similarly, the second composite detection unit 210B includes a third detection unit 10B, a fourth detection unit 20B, a fourth arithmetic circuit 31B, a fifth arithmetic circuit 32B, and a sixth arithmetic circuit 33B that are the same in configuration as the first detection unit 10, the second detection unit 20, the first arithmetic circuit 31, the second arithmetic circuit 32, and the third arithmetic circuit 33, respectively. The first detection unit 10A is located in a first position, the second detection unit 20A is located in a second position, the third detection unit 10B is located in a third position, and the fourth detection unit 20B is located in a fourth position.

As shown in FIG. 14, the rotating field sensor 101 according to the present embodiment further includes a field generation unit 102 for generating a rotating magnetic field. The field generation unit 102 has the same configuration as that of the field generation unit 62 of the second embodiment. Specifically, the field generation unit 102 has a ring-shaped magnet 103 attached to a rotating shaft 66. The magnet 103 includes a first layer 103A and a second layer 103B that are the same in configuration as the first layer 63A and the second layer 63B, respectively. In the present embodiment, each of the first layer 103A and the second layer 103B includes two pairs of N and S poles.

The relative positional relationship of the first and second detection units 10A and 20A with respect to the magnet 103 is the same as that of the first and second detection units 10 and 20 with respect to the magnet 63 in the second embodiment. The relative positional relationship of the third and fourth detection units 1013 and 20B with respect to the magnet 103 is also the same as that of the first and second detection units 10 and 20 with respect to the magnet 63 in the second embodiment. The third and fourth detection units 10B and 20B are located in positions offset from the positions of the first and second detection units 10A and 20A, respectively, by an amount equivalent to ⅛ the period of the rotation of the rotating magnetic field, i.e., as much as an electrical angle of 45°.

The position where the first detection unit 10A is located is the first position. The position where the second detection unit 20A is located is the second position. The rotating magnetic field includes a first partial magnetic field MF1 in the first position and a second partial magnetic field MF2 in the second position. The first and second partial magnetic fields MF1 and MF2 are generated by the magnet 103 on the same principle as in the second embodiment. The first partial magnetic field MF1 and the second partial magnetic field MF2 differ in direction by 180° and rotate in the same direction of rotation.

The first detection unit 10A detects a first applied field in the first position. The first applied field includes the first partial magnetic field MF1 as its main component. The second detection unit 20A detects a second applied field in the second position. The second applied field includes the second partial magnetic field MF2 as its main component. A first direction serving as the reference direction for one component of the first applied field and a third direction serving as the reference direction for one component of the second applied field are different from each other by 180°. A second direction serving as the reference direction for another component of the first applied field and a fourth direction serving as the reference direction for another component of the second applied field are different from each other by 180°. The first direction is, for example, from the center to rotation C to the first detection unit 10A.

The position where the third detection unit 10B is located is the third position. The position where the fourth detection unit 20B is located is the fourth position. The rotating magnetic field further includes a third partial magnetic field MF3 in the third position and a fourth partial magnetic field MF4 in the fourth position. The third and fourth partial magnetic fields MF3 and MF4 are generated by the magnet 103 on the same principle as with the first and second partial magnetic fields MF1 and MF2. The third partial magnetic field MF3 and the fourth partial magnetic field MF4 differ in direction by 180° and rotate in the same direction of rotation as that of the first and second partial magnetic fields MF1 and MF2.

The third detection unit 10B detects a third applied field in the third position. The third applied field includes the third partial magnetic field MF3 as its main component. The fourth detection unit 20B detects a fourth applied field in the fourth position. The fourth applied field includes the fourth partial magnetic field MF4 as its main component. Hereinafter, the direction serving as a reference direction for one component of the third applied field will be referred to as a fifth direction, and the direction serving as a reference direction for another component of the third applied field will be referred to as a sixth direction. The direction serving as a reference direction for one component of the fourth applied field will be referred to as a seventh direction, and the direction serving as a reference direction for another component of the fourth applied field will be referred to as an eighth direction. The fifth direction and the seventh direction are parallel to each other. The sixth direction and the eighth direction are parallel to each other. In the present embodiment, in particular, the fifth direction and the seventh direction are different from each other by 180°. The sixth direction and the eighth direction are different from each other by 180°. The fifth direction is, for example, from the center to rotation C to the third detection unit 10B.

In the present embodiment, the angle that the direction of the third partial magnetic field MF3 forms with respect to the fifth direction is different from the angle that the direction of the first partial magnetic field MF1 forms with respect to the first direction by an angle equivalent to an electrical angle of 45°. Similarly, the angle that the direction of the fourth partial magnetic field MF4 forms with respect to the seventh direction is different from the angle that the direction of the second partial magnetic field MF2 forms with respect to the fourth direction by an angle equivalent to an electrical angle of 45°.

The first detection unit 10A includes a first detection circuit 11A and a second detection circuit 12A. The first detection circuit 11A and the second detection circuit 12A are the same in configuration as the first detection circuit 11 and the second detection circuit 12 of the first embodiment, respectively. The first detection circuit 11A detects the intensity of the component of the first applied field in the first direction, and outputs a signal that indicates the intensity. The second detection circuit 12A detects the intensity of the component of the first applied field in the second direction, and outputs a signal that indicates the intensity. The first direction serves as a reference direction when the first detection circuit 11A detects the first applied field. The second direction serves as a reference direction when the second detection circuit 12A detects the first applied field.

The second detection unit 20A includes a third detection circuit 21A and a fourth detection circuit 22A. The third detection circuit 21A and the fourth detection circuit 22A are the same in configuration as the third detection circuit 21 and the fourth detection circuit 22 of the first embodiment, respectively. The third detection circuit 21A detects the intensity of the component of the second applied field in the third direction, and outputs a signal that indicates the intensity. The fourth detection circuit 22A detects the intensity of the component of the second applied field in the fourth direction, and outputs a signal that indicates the intensity. The third direction serves as a reference direction when the third detection circuit 21A detects the second applied field. The fourth direction serves as a reference direction when the fourth detection circuit 22A detects the second applied field.

The third detection unit 10B includes a fifth detection circuit 11B and a sixth detection circuit 12B. The fifth detection circuit 11B and the sixth detection circuit 12B are the same in configuration as the first detection circuit 11 and the second detection circuit 12 of the first embodiment, respectively. The fifth detection circuit 11B detects the intensity of the component of the third applied field in the fifth direction, and outputs a signal that indicates the intensity. The sixth detection circuit 12B detects the intensity of the component of the third applied field in the sixth direction, and outputs a signal that indicates the intensity. The fifth direction serves as a reference direction when the fifth detection circuit 11B detects the third applied field. The sixth direction serves as a reference direction when the sixth detection circuit 12B detects the third applied field.

The fourth detection unit 20B includes a seventh detection circuit 21B and an eighth detection circuit 22B. The seventh detection circuit 21B and the eighth detection circuit 22B are the same in configuration as the third detection circuit 21 and the fourth detection circuit 22 of the first embodiment, respectively. The seventh detection circuit 21B detects the intensity of the component of the fourth applied field in the seventh direction, and outputs a signal that indicates the intensity. The eighth detection circuit 22B detects the intensity of the component of the fourth applied field in the eighth direction, and outputs a signal that indicates the intensity. The seventh direction serves as a reference direction when the seventh detection circuit 21B detects the fourth applied field. The eighth direction serves as a reference direction when the eighth detection circuit 22B detects the fourth applied field.

In the example shown in FIG. 14, each of the first layer 103A and the second layer 103B includes two pairs of N and S poles. One rotation of the magnet 103 produces two rotations of the first partial magnetic field MF1 and the second partial magnetic field MF2. In this case, one period of the output signals of the detection circuits 11A, 12A, 21A, 22A, 11B, 12B, 21B, and 22B, i.e., an electrical angle of 360°, is equivalent to a one-half rotation of the magnet 103, i.e., an angle of rotation of 180° of the magnet 103. The output signals of the first to eighth detection circuits 11A, 12A, 21A, 22A, 11B, 12B, 21B, and 22B have the same period. In the following description, the period of the output signals of the first to eighth detection circuits 11A, 12A, 21A, 22A, 11B, 12B, 21B, and 22B will be referred to as period T. The output signal of the second detection circuit 12A differs from the output signal of the first detection circuit 11A in phase by an odd number of times ¼ the period T. The output signal of the third detection circuit 21A differs from the output signal of the first detection circuit 11A in phase by an integer multiple of ½ the period T. The output signal of the fourth detection circuit 22A differs from the output signal of the third detection circuit 21A in phase by an odd number of times ¼ the period T. The output signal of the sixth detection circuit 12B differs from the output signal of the fifth detection circuit 11B in phase by an odd number of times ¼ the period T. The output signal of the seventh detection circuit 21B differs from the output signal of the fifth detection circuit 11B in phase by an integer multiple of ½ the period T. The output signal of the eighth detection circuit 22B differs from the output signal of the seventh detection circuit 21B in phase by an odd number of times ¼ the period. T.

The first arithmetic circuit 31A generates a first signal that has a correspondence relationship with both the intensity of the component of the first applied field in the first direction and the intensity of the component of the second applied field in the third direction, based on the output signals of the first and third detection circuits 11A and 21A. The second arithmetic circuit 32A generates a second signal that has a correspondence relationship with both the intensity of the component of the first applied field in the second direction and the intensity of the component of the second applied field in the fourth direction, based on the output signals of the second and fourth detection circuits 12A and 22A. Based on the first signal and the second signal, the third arithmetic circuit 33A calculates a detected value of the angle that the direction of the rotating magnetic field in a first reference position forms with respect to a first reference direction. Hereinafter, the detected value calculated by the third arithmetic circuit 33A will be referred to as a first detected angle value and denoted by symbol θAs. The first detected angle value θAs is calculated by the same method as with the detected angle value θs in the first embodiment. Leaving errors aside, the first detected angle value θAs has a difference of constant value (including 0) from the angle that the direction of the rotating magnetic field in a reference position forms with respect to a reference direction. The first detected angle value θAs thus has a correspondence relationship with the angle that the direction of the rotating magnetic field in the reference position forms with the respect to the reference direction.

The fourth arithmetic circuit 31B generates a third signal that has a correspondence relationship with both the intensity of the component of the third applied field in the fifth direction and the intensity of the component of the fourth applied field in the seventh direction, based on the output signals of the fifth and seventh detection circuits 11B and 21B. The fifth arithmetic circuit 32B generates a fourth signal that has a correspondence relationship with both the intensity of the component of the third applied field in the sixth direction and the intensity of the component of the fourth applied field in the eighth direction, based on the output signals of the sixth and eighth detection circuits 12B and 22B. Based on the third signal and the fourth signal, the sixth arithmetic circuit 33B calculates a detected value of the angle that the direction of the rotating magnetic field in a second reference position forms with respect to a second reference direction. Hereinafter, the detected value calculated by the sixth arithmetic circuit 33B will be referred to as a second detected angle value and denoted by symbol θBs. The second detected angle value θBs is calculated by the same method as with the detected angle value θs in the first embodiment. Leaving errors aside, the second detected angle value θBs has a difference of constant value (including 0) from the angle that the direction of the rotating magnetic field in the reference position forms with respect to the reference direction. The second detected angle value θBs thus has a correspondence relationship with the angle that the direction of the rotating magnetic field in the reference position forms with the respect to the reference direction.

As shown in FIG. 16, the rotating field sensor 101 further includes a seventh arithmetic circuit 211 that calculates a detected angle value θs having a correspondence relationship with the angle that the direction of the rotating magnetic field in the reference position of the rotating field sensor 101 forms with respect to the reference direction of the rotating field sensor 101. The seventh arithmetic circuit 211 calculates the detected angle value θs based on the first detected angle value θAs calculated by the third arithmetic circuit 30A and the second detected angle value θBs calculated by the sixth arithmetic circuit 30B. The seventh arithmetic circuit 211 can be implemented by a microcomputer, for example. The reference position and the reference direction of the rotating field sensor 101 may coincide with the first reference position and the first reference direction, respectively, or with the second reference position and the second reference direction, respectively, or may be any position and direction different from those positions and directions.

A description will now be given of the configuration of a rotating field sensor 101 of a modification example of the present embodiment. As shown in FIG. 15, the rotating field sensor 101 of the modification example of the present embodiment has a field generation unit 112 instead of the field generation unit 102. The field generation unit 112 has the same configuration as that of the field generation unit 72 of the second embodiment. Specifically, the field generation unit 112 includes a magnet 113 having the same configuration as that of the magnet 73. The magnet 113 makes a straight movement in its longitudinal direction along with a straight movement of the object. As a result, a rotating magnetic field occurs based on the magnetic field generated by the magnet 113. The magnet 113 includes a first layer 113A and a second layer 113B that are the same in configuration as the first layer 73A and the second layer 73B, respectively.

The relative positional relationship of the first and second detection units 10A and 20A with respect to the magnet 113 is the same as that of the first and second detection units 10 and 20 with respect to the magnet 73 in the second embodiment. The relative positional relationship of the third and fourth detection units 10B and 20B with respect to the magnet 113 is also the same as that of the first and second detection units 10 and 20 with respect to the magnet 73 in the second embodiment. In the modification example, the third and fourth detection units 10B and 20B are located in positions offset from the positions of the first and second detection units 10A and 20A, respectively, by an amount equivalent to ⅛ the period of the rotation of the rotating magnetic field or an electrical angle of 45°, i.e., as much as a one-eighth pitch of the magnet 113.

Next, the method by which the seventh arithmetic circuit 211 calculates the detected angle value θs will be described. In the present embodiment, the seventh arithmetic circuit 211 calculates the detected angle value θs based on the first detected angle value θAs calculated by the third arithmetic circuit 33A of the composite detection unit 210A and the second detected angle value θBs calculated by the sixth arithmetic circuit 33B of the composite detection unit 210B. In the examples shown in FIG. 14 and FIG. 15, the third and fourth detection units 10B and 20B of the composite detection unit 210B are located in positions offset from the positions of the first and second detection units 10A and 20A of the composite detection unit 210A by an amount equivalent to an electrical angle of 45°. The first detected angle value θAs obtained by the detection of the first and second applied fields therefore differs from the second detected angle value θBs obtained by the detection of the third and fourth applied fields in phase by an electrical angle of 45°. In such examples, the seventh arithmetic circuit 211 calculates θs by the following equation (8):

$$\theta s = (\theta As + \theta Bs + \pi/4)/2 \qquad (8)$$

Next, the operation and effects of the rotating field sensor 101 will be described. In the rotating field sensor 101, the third arithmetic circuit 33A calculates the first detected angle value θAs based on the first signal and the second signal. The first signal is generated based on the output signals of the first and third detection circuits 11A and 21A, and the second signal is generated based on the output signals of the second and fourth detection circuits 12A and 22A. In the rotating field sensor 101, the sixth arithmetic circuit 33B calculates the second detected angle value θBs based on the third signal and the fourth signal. The third signal is generated based on the output signals of the fifth and seventh detection circuits 11B and 21B, and the fourth signal is generated based on the output signals of the sixth and eighth detection circuits 12B and 22B. Based on the first detected angle value θAs and the second detected angle value θBs, the seventh arithmetic circuit 211 calculates, by using the equation (8), the detected angle value θs that has a correspondence relationship with the angle that the direction of the rotating magnetic field in the reference position forms with respect to the reference direction.

Figure 17:
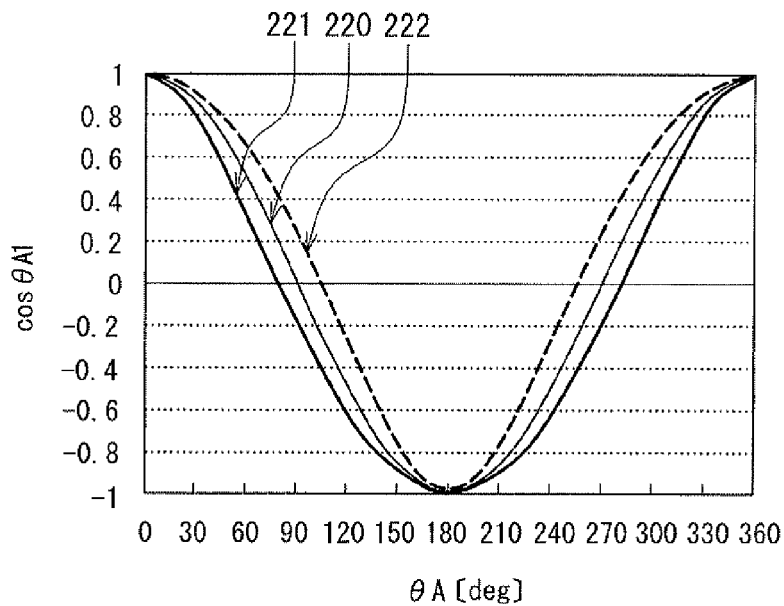
FIG. 17 is a waveform chart showing how the output signals of the detection circuits of the rotating field sensor according to the fourth embodiment of the invention are distorted in waveform.

As described in the first embodiment, the waveforms of the output signals of the detection circuits 11A, 12A, 21A, 22A, 11B, 12B, 21B, and 22B ideally trace a sinusoidal curve (including a sine waveform and a cosine waveform). In actuality, however, the waveforms of the output signals of the detection circuits 11A, 12A, 21A, 22A, 11B, 12B, 21B, and 22B are distorted from a sinusoidal curve since the output signal waveforms of the MR elements are distorted due to the MR elements. Examples of the situation where the output signal waveforms of the MR elements are distorted due to the MR elements include: when the directions of magnetization of the magnetization pinned layers in the MR elements vary due to the influence of the rotating magnetic field or the like; and when the directions of magnetization of the free layers in the MR elements do not coincide with the direction of the first applied field or the second applied field due to the influence of such factors as the shape anisotropy and coercivity of the free layers. FIG. 17 illustrates how the output signals of the detection circuits are distorted in waveform. FIG. 17 shows the waveform of the output signal of the detection circuit 12A which typifies the detection circuits 11A, 12A, 21A, 22A, 11B, 12B, 21B, and 22B. In FIG. 17, the angle that the direction of the rotating magnetic field in the first reference position forms with respect to the first reference direction is represented by symbol θA, and the output signal of the detection circuit 12A is represented by symbol cos θA1. In FIG. 17, the horizontal axis indicates the angle θA, and the vertical axis indicates the output signal cos θA1. The reference numeral 220 designates an ideal sinusoidal curve. The two waveforms designated by the reference numerals 221 and 222 show waveforms that are distorted due to the MR elements.

As mentioned above, the output signals of the detection circuits HA, 12A, 21A, and 22A are distorted in waveform due to the MR elements. The first detected angle value θAs therefore includes a first angular error dθA with respect to a theoretical value of the first detected angle value θAs that is expected when the first applied field consists only of the first partial magnetic field MF1, the second applied field consists only of the second partial magnetic field MF2, and the directions of the first and second partial magnetic fields MF1 and MF2 make an ideal rotation. Similarly, the output signals of the detection circuits 11B, 12B, 21B, and 22B are distorted in waveform due to the MR elements. The second detected angle value θBs therefore includes a second angular error dθB with respect to a theoretical value of the second detected angle value θBs that is expected when the third applied field consists only of the third partial magnetic field MF3, the fourth applied field consists only of the fourth partial magnetic field MF4, and the directions of the third and fourth partial magnetic fields MF3 and MF4 make an ideal rotation. The first angular error dθA and the second angular error dθB make periodic changes with the same error period in response to changes of the directions of the first to fourth partial magnetic fields MF1, MF2, MF3, and MF4. The change of the first angular error dθA depends on a change of the first detected angle value θAs, and the change of the second angular error dθB depends on a change of the second detected angle value θBs. When the waveforms of the output signals of the detection circuits are distorted as shown in FIG. 17, the error period is ¼ the period of the output signals of the detection circuits, i.e., π/2 (electrical angle of 90°).

Figure 18:
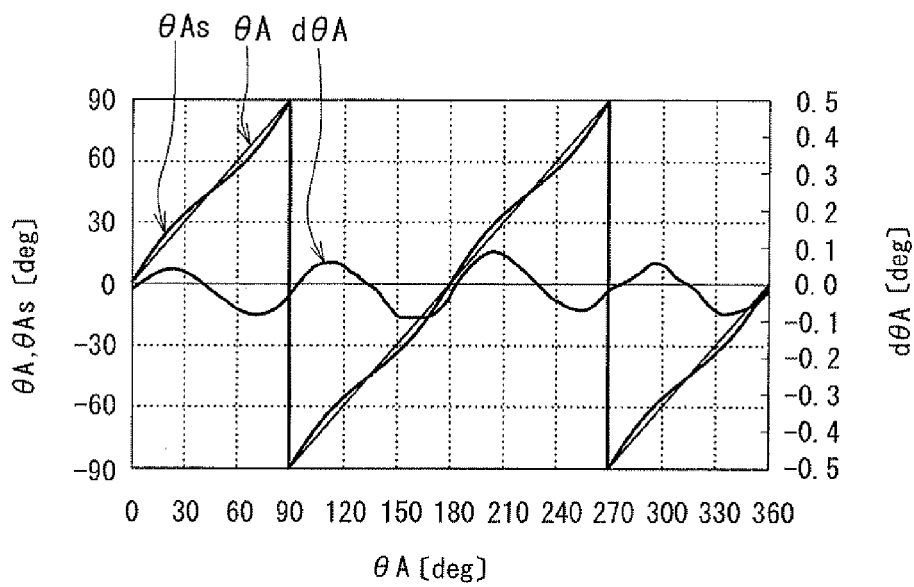
FIG. 18 is a waveform chart showing the relationship between a first detected angle value and a first angular error in the fourth embodiment of the invention.

FIG. 18 shows the relationship between the first detected angle value θAs and the first angular error dθA. In FIG. 18, the horizontal axis indicates the angle θA, and the vertical axis indicates the angle θA, the first detected angle value θAs, and the first angular error dθA. For the sake of convenience, FIG. 18 shows the angle θA and the first detected angle value θAs on the vertical axis in values after a subtraction of 180° if the actual angles are in the range of 90° to 270°, and in values after a subtraction of 360° if the actual angles are in the range of 270° to 360°. In the following description, charts similar to FIG. 18 will be shown in the same way as with FIG. 18. The relationship between the second detected angle value θBs and the second angular error dθB is the same as in FIG. 18. For ease of understanding, FIG. 18 shows the waveform of the first detected angle value θAs with emphasis on the component of the angular error dθA. The same holds for other charts that are similar to FIG. 18.

Figure 19:
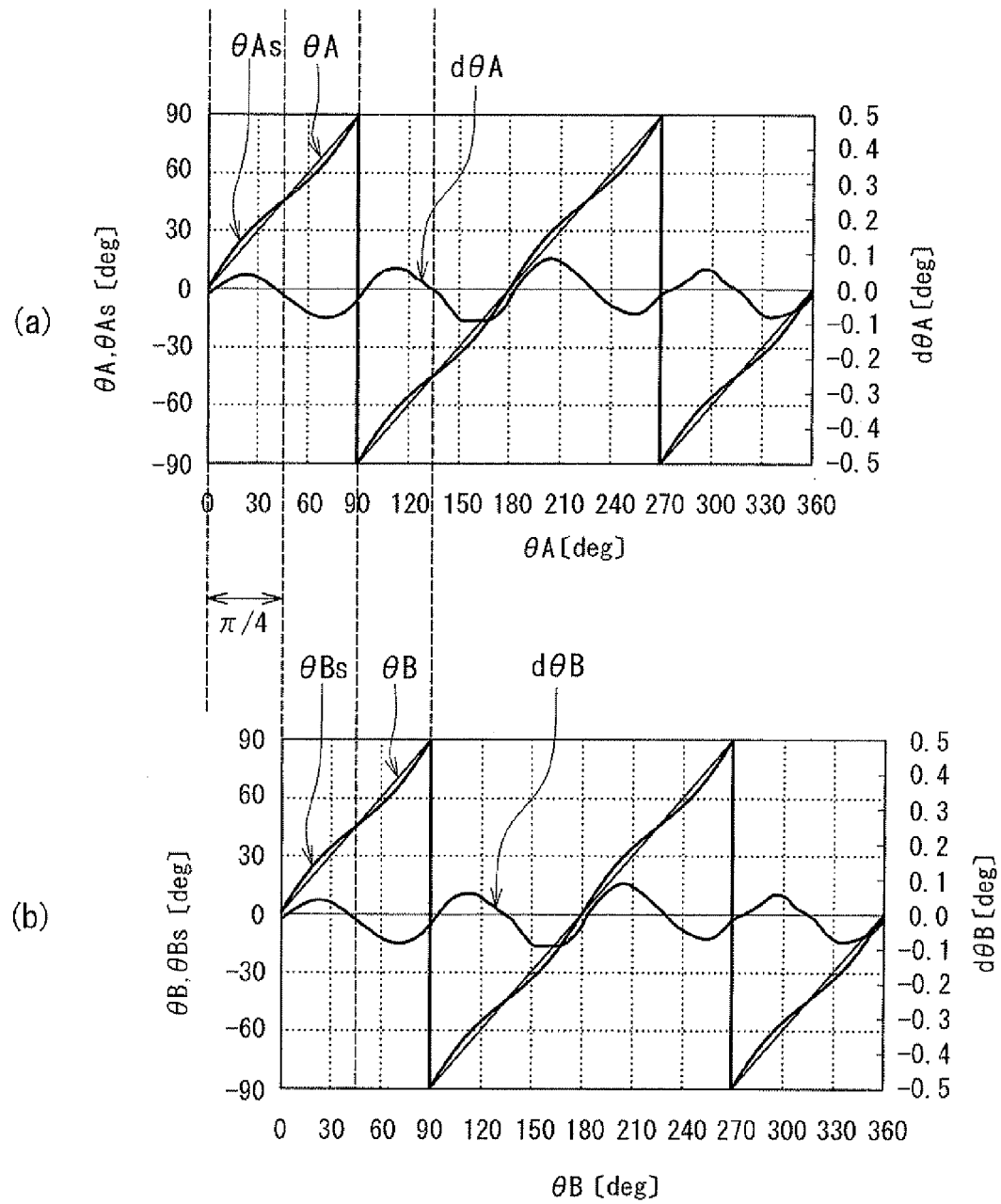
FIG. 19 is an explanatory diagram showing the operation of reducing an angular error in the fourth embodiment of the invention.

In the present embodiment, the first detected angle value θAs and the second detected angle value θBs differ in phase by ½ the error period, i.e., by π/4 (electrical angle of 45°). To achieve such a difference, in the present embodiment, the third position and the fourth position are offset from the first position and the second position, respectively, by an amount equivalent to ½ the error period (electrical angle of 45°). According to the present embodiment, it is possible to cancel out the first angular error dθA and the second angular error dθB. This will be described with reference to FIG. 19 and FIG. 20. Portion (a) of FIG. 19 shows the relationship between the first detected angle value θAs and the first angular error dθA shown in FIG. 18. Portion (b) of FIG. 19 shows the relationship between the second detected angle value θBs and the second angular error dθB. In FIG. 19(b), the angle that the direction of the rotating magnetic field in the second reference position forms with respect to the second reference direction is represented by symbol θB. In the example shown in FIG. 19, the first angular error dθA and the second angular error dθB have an amplitude of ±0.09°. In the present embodiment, the first detected angle value θAs and the second detected angle value θBs are given a difference in phase by an odd number of times ½ the error period, i.e., by an odd number of times π/4. The detected angle value θs is then calculated by using the first detected angle value θAs and the second detected angle value θBs. When calculating the detected angle value θs, the first angular error dθA and the second angular error dθB are thus in opposite phases. Consequently, the first angular error dθA and the second angular error dθB cancel each other out.

Figure 20:
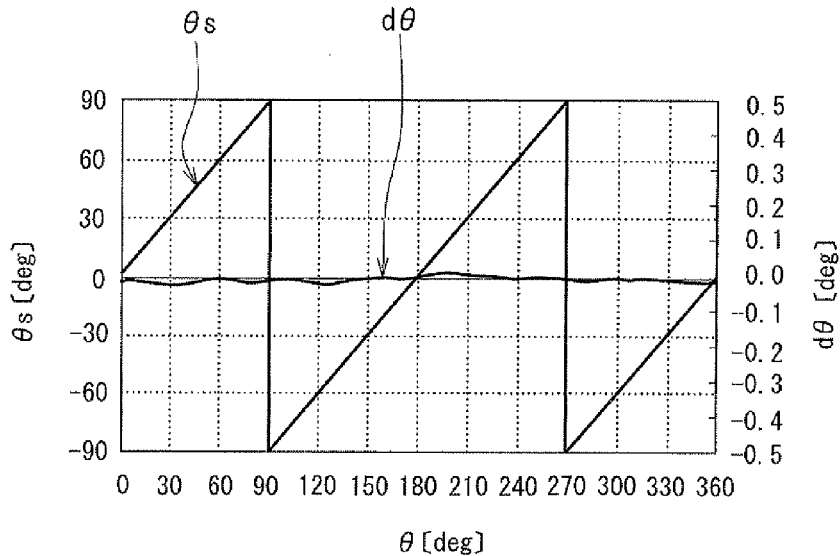
FIG. 20 is a waveform chart showing the relationship between a detected angle value and an angular error in the fourth embodiment of the invention.

FIG. 20 shows the relationship between the detected angle value θs calculated as described above and an angular error dθ included in the detected angle value θs. In FIG. 20, the angle that the direction of the rotating magnetic field in a reference position forms with respect to a reference direction is represented by symbol θ. As shown in FIG. 20, the angular error dθ is significantly smaller than the first angular error dθA and the second angular error dθB. In the example shown in FIG. 20, the angular error dθ has an amplitude of ±0.02°.

It should be noted that the difference in phase between the first detected angle value θAs and the second detected angle value θBs is not limited to ½ the error period, and may be any odd number of times ½ the error period. In such a case, the first angular error dθA and the second angular error dθB are cancelled out to significantly reduce the angular error dθ that is included in the detected angle value θs. For example, the third and fourth detection units 10B and 20B of the composite detection unit 210B may be located in positions offset from the positions of the first and second detection units 10A and 20A of the composite detection unit 210A by an amount equivalent to an odd number of times ½ the error period in the direction of rotation of the field generation unit 102. This can make the difference in phase between the first detected angle value θAs and the second detected angle value θBs an odd number of times ½ the error period.

In the present embodiment, the detected angle is corrected by using the two detection units 10A and 20A or 10B and 20B which have exactly the same configuration except in the directions of magnetization of the magnetization pinned layers in the MR elements. Therefore, even if the angular errors in the respective detection units vary as a function of temperature, it is possible to cancel out the angular errors in the respective detection units, including temperature-based variations of the angular errors, to correct the detected angle. Consequently, according to the present embodiment, it is eventually possible to obtain a detected angle value with less temperature-based error variations.

In the present embodiment, the first detected angle value θAs is calculated by the same method as with the detected angle value θs in the first embodiment. Consequently, as discussed in the first embodiment, when a noise field $H_{ext}$ other than the rotating magnetic field is applied to the rotating field sensor 101 from outside, the noise components included in the respective output signals of the first detection circuit 11A and the third detection circuit 21A have a value with opposite signs, and the noise components included in the respective output signals of the second detection circuit 12A and the fourth detection circuit 22A have a value with opposite signs. According to the present embodiment, it is therefore possible to reduce errors in the first detected angle value θAs resulting from the noise field $H_{ext}$, for the same reason as in the description of the first embodiment.

Similarly, in the present embodiment, the second detected angle value θBs is calculated by the same method as with the detected angle value θs in the first embodiment. Consequently, as discussed in the first embodiment, when a noise field $H_{ext}$ other than the rotating magnetic field is applied to the rotating field sensor 101 from outside, the noise components included in the respective output signals of the fifth detection circuit 11B and the seventh detection circuit 21B have a value with opposite signs, and the noise components included in the respective output signals of the sixth detection circuit 12B and the eighth detection circuit 22B have a value with opposite signs. According to the present embodiment, it is therefore possible to reduce errors in the second detected angle value θBs resulting from the noise field $H_{ext}$ for the same reason as in the description of the first embodiment. As described above, according to the present embodiment, it is possible to reduce errors resulting from the noise field $H_{ext}$ in the first and second detected angle values θAs and θBs. This makes it possible to reduce errors resulting from the noise field $H_{ext}$ even in the detected angle value θs, the final result.

The other configuration, operation, and effects of the present embodiment are the same as those of the second embodiment.

Fifth Embodiment

Figure 21:
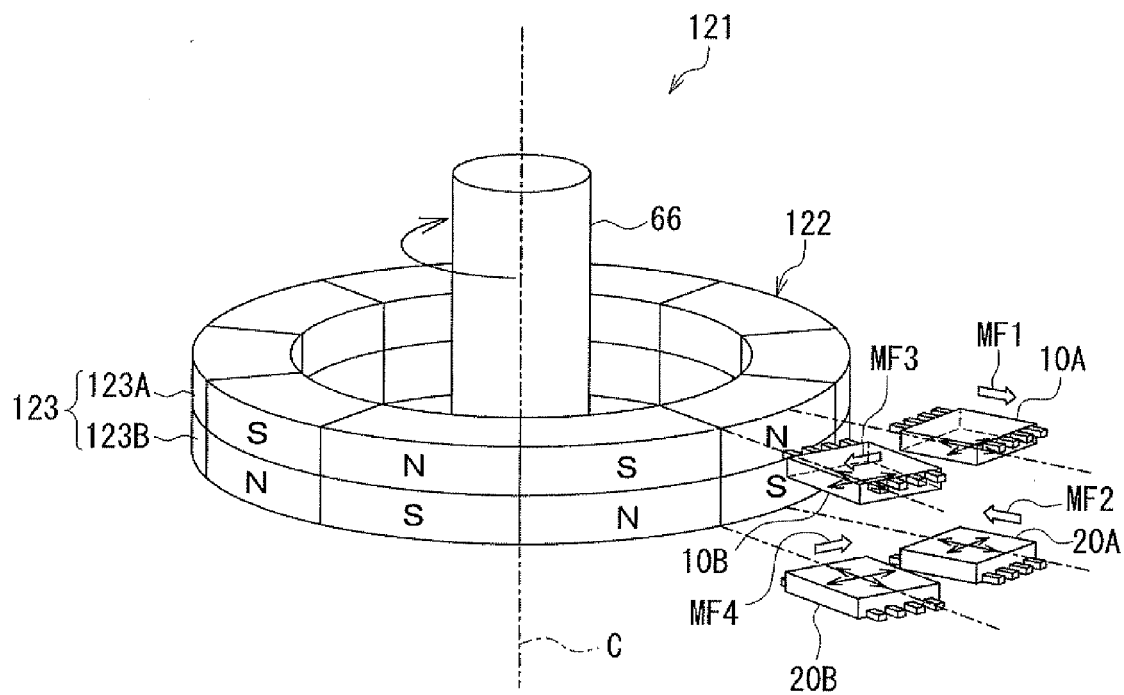
FIG. 21 is a perspective view showing the general configuration of a rotating field sensor according to a fifth embodiment of the invention.
Figure 22:
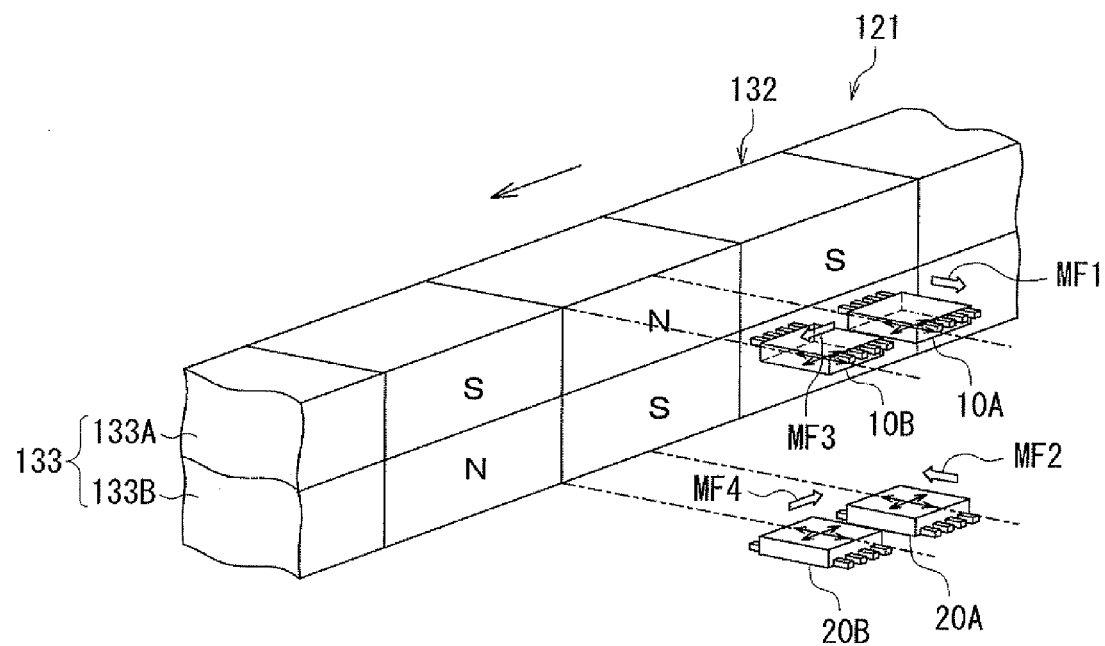
FIG. 22 is a perspective view showing the general configuration of a rotating field sensor of a modification example of the fifth embodiment of the invention.

A rotating field sensor according to a fifth embodiment of the invention will now be described with reference to FIG. 21 and FIG. 22. FIG. 21 is a perspective view showing the general configuration of the rotating field sensor according to the present embodiment. FIG. 22 is a perspective view showing the general configuration of a rotating field sensor of a modification example of the present embodiment. First, a description will be given of the configuration of the rotating field sensor 121 according to the present embodiment. The configuration of the rotating field sensor 121 is basically the same as that of the rotating field sensor 101 according to the fourth embodiment shown in FIG. 14. The rotating field sensor 121 has a field generation unit 122 for generating a rotating magnetic field, instead of the field generation unit 102 of the fourth embodiment. The field generation unit 122 has the same configuration as that of the field generation unit 62 of the second embodiment. Specifically, the field generation unit 122 has a ring-shaped magnet 123 attached to a rotating shaft 66. The magnet 123 includes a first layer 123A and a second layer 123B that are the same in configuration as the first layer 63A and the second layer 63B, respectively.

In the present embodiment, the relative positional relationship of the first and second detection units 10A and 20A with respect to the magnet 123 and that of the third and fourth detection units 10B and 20B with respect to the magnet 123 are the same. The third and fourth detection units 10B and 20B are located in positions offset from the positions of the first and second detection units 10A and 20A, respectively, by an amount equivalent to ¼ the period of the rotation of the rotating magnetic field, i.e., as much as an electrical angle of 90°. The position where the first detection unit 10A is located is the first position. The position where the second detection unit 20A is located is the second position. The position where the third detection unit 10B is located is the third position. The position where the fourth detection unit 20B is located is the fourth position.

In the present embodiment, the angle that the direction of the third partial magnetic field MF3 forms with respect to the fifth direction is different from the angle that the direction of the first partial magnetic field MF1 forms with respect to the first direction by an angle equivalent to an electrical angle of 90°. Similarly, the angle that the direction of the fourth partial magnetic field MF4 forms with respect to the seventh direction is different from the angle that the direction of the second partial magnetic field MF2 forms with respect to the fourth direction by an angle equivalent to an electrical angle of 90°.

Now, a description will be given of the configuration of the rotating field sensor 121 of the modification example of the present embodiment shown in FIG. 22. The rotating field sensor 121 of the modification example has basically the same configuration as that of the rotating field sensor 101 of the modification example of the fourth embodiment shown in FIG. 15. The rotating field sensor 121 has a field generation unit 132 instead of the field generation unit 112 of the fourth embodiment. The field generation unit 132 has the same configuration as that of the field generation unit 72 of the second embodiment. Specifically, the field generation unit 132 includes a magnet 133 having the same configuration as that of the magnet 73. The magnet 133 makes a straight movement in its longitudinal direction along with a straight movement of the object. As a result, a rotating magnetic field occurs based on the magnetic field generated by the magnet 133. The magnet 133 includes a first layer 133A and a second layer 133B that are the same in configuration as the first layer 73A and the second layer 73B, respectively.

In this modification example, the third detection unit 10B is located in a position offset from the position of the first detection unit 10A by an amount equivalent to ¼ the period of the rotation of the rotating magnetic field, or an electrical angle of 90°, i.e., as much as a one-fourth pitch of the magnet 133. The fourth detection unit 20B is located in a position offset from the position of the second detection unit 20A by an amount equivalent to ¼ the period of the rotation of the rotating magnetic field, or an electrical angle of 90°, i.e., as much as a one-fourth pitch of the magnet 133.

Next, the calculation method for the detected angle value θs of the present embodiment will be described. In the present embodiment, the first and second detected angle values θAs and θBs are calculated by the same method as in the fourth embodiment. In the examples shown in FIG. 21 and FIG. 22, the third position and the fourth position are offset from the first position and the second position, respectively, by an amount equivalent to an electrical angle of 90°. The first detected angle value θAs and the second detected angle value θBs are different in phase by an electrical angle of 90°. In such examples, the seventh arithmetic circuit 211 calculates θs by the following equation (9):

$$\theta s = (\theta As + \theta Bs + \pi/2)/2 \quad (9)$$

The effects of the rotating field sensor 121 will now be described. The rotating field sensor 121 according to the present embodiment is suitable for reducing angular errors resulting from the rotating magnetic field. First, the reason for the occurrence of angular errors due to the rotating magnetic field will be described with reference to FIG. 21 to FIG. 23. In the example shown in FIG. 21, each of the first and second partial magnetic fields MF1 and MF2 includes not-shown components Hr and Hθ. The component Hr is in the radial direction of the magnet 123. The component Hθ is in the direction orthogonal to Hr within a plane perpendicular to the center of rotation C. In the example shown in FIG. 22, each of the first and second partial magnetic fields MF1 and MF2 includes not-shown components Hr and Hθ. The component Hr is in the direction orthogonal to the direction of movement of the magnet 133 within a plane perpendicular to the direction of arrangement of the first detection unit 10A and the second detection unit 20A. The component Hθ is in the direction orthogonal to Hr within the foregoing plane.

Figure 23:
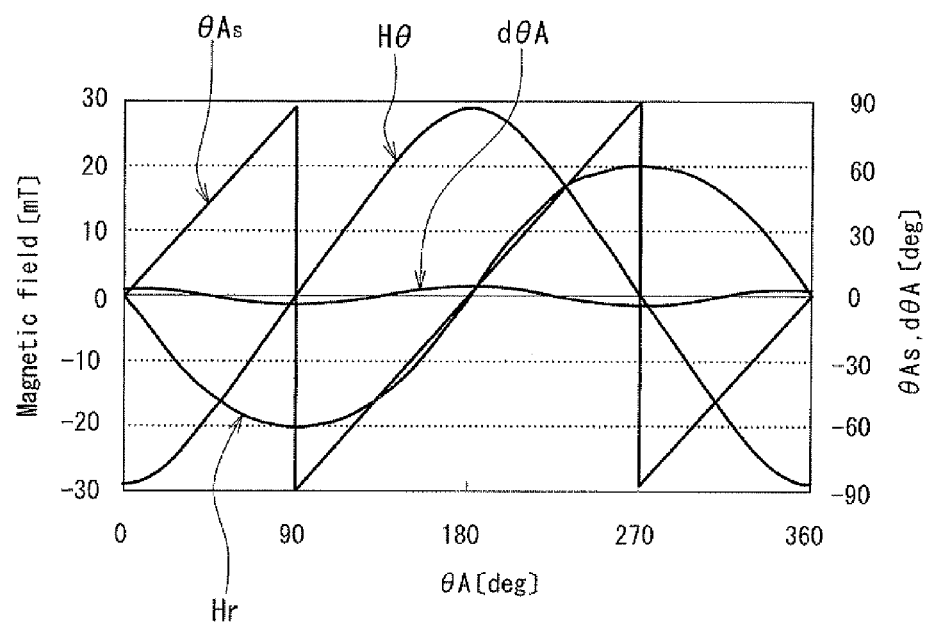
FIG. 23 is a waveform chart showing the relationship between a first partial magnetic field, a first detected angle value, and a first angular error in the fifth embodiment of the invention.

Suppose, in the example shown in FIG. 21 or FIG. 22, the following situation: the first applied field consists only of the first partial magnetic field MF1, the first detection unit 10A detects the direction of the first applied field, the second applied field consists only of the second partial magnetic field MF2, the second detection unit 20A detects the direction of the second applied field, and the first detected angle value θAs is determined based on the output signals of the detection units 10A and 20A. FIG. 23 shows an example of the relationship between Hr, Hθ, θAs, and a first angular error dθA in such a case. Note that FIG. 23 shows Hr and Hθ of the first partial magnetic field MF1. In FIG. 23, the horizontal axis indicates the angle θA, and the vertical axes indicate Hr, Hθ, θAs, and dθA. For ease of understanding, FIG. 23 shows the waveform of the first angular error dθA with exaggerated amplitude. In the example shown in FIG. 21 or FIG. 22, the directions of the first and second partial magnetic fields MF1 and MF2 and the intensities of the components of the first and second partial magnetic fields MF1 and MF2 in one direction sometimes fail to make a sinusoidal change. In such a case, the first detected angle value θAs includes a first angular error dθA. The change of the first angular error dθA here depends on a change of the directions of the first and second partial magnetic fields MF1 and MF2. The first angular error dθA has an error period of ½ the period of the rotation of the direction of the rotating magnetic field. Suppose also the following situation: the third applied field consists only of the third partial magnetic field MF3, the third detection unit 10B detects the direction of the third applied field, the fourth applied field consists only of the fourth partial magnetic field MF2, the fourth detection unit 20B detects the direction of the fourth applied field, and the second detected angle value θBs is determined based on the output signals of the detection units 10B and 20B. In such a case, the second detected angle value θBs includes a second angular error dθB that changes depending on a change of the direction of the rotating magnetic field. The second angular error dθB has an error period of ½ the period of the rotation of the direction of the rotating magnetic field.

Figure 24:
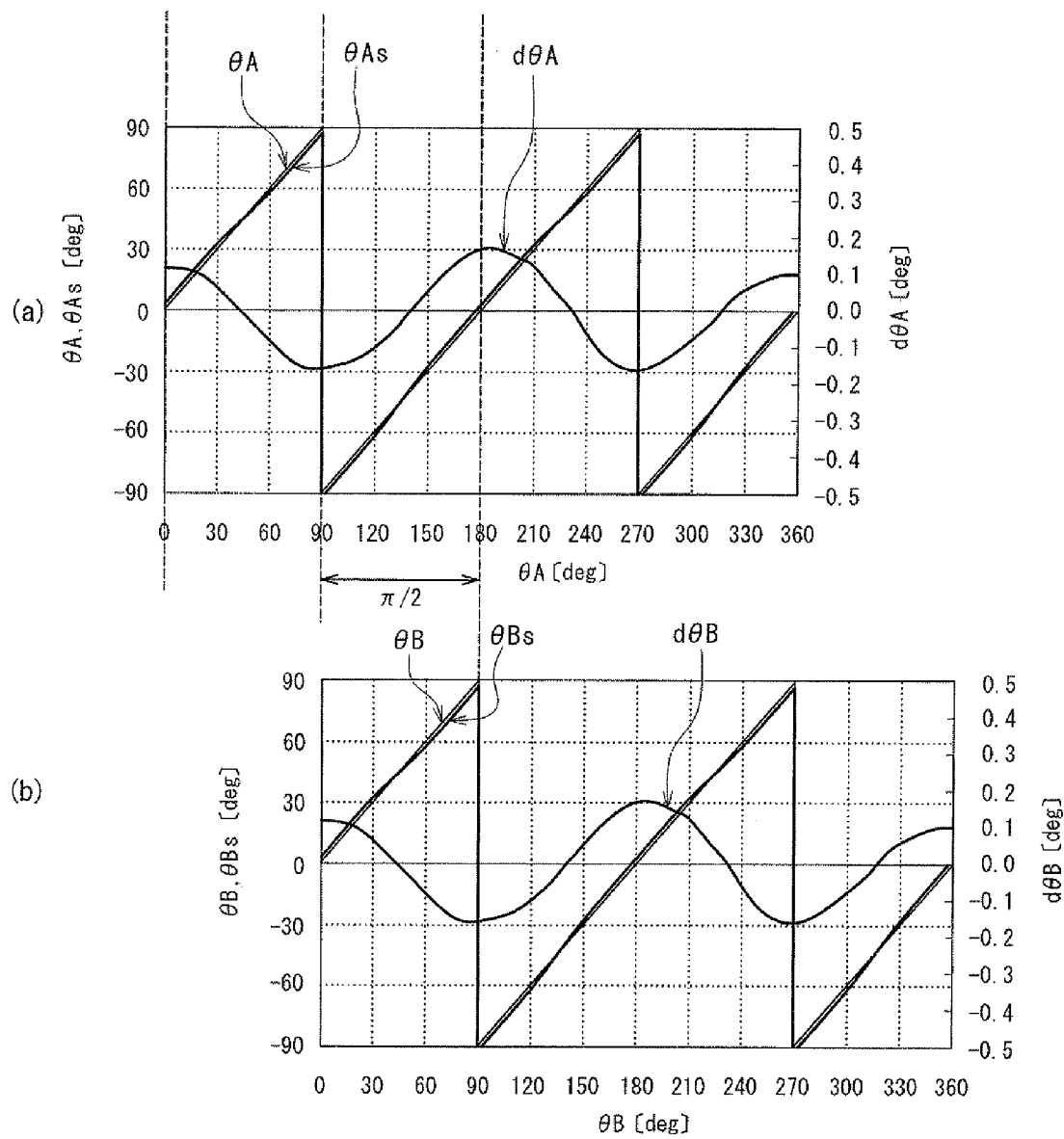
FIG. 24 is an explanatory diagram showing the operation of reducing an angular error in the fifth embodiment of the invention.

Next, with reference to FIG. 24 and FIG. 25, a description will be given of how the rotating field sensor 121 can be used to reduce the angular errors resulting from the rotating magnetic field. Portion (a) of FIG. 24 shows the relationship between the first detected angle value θAs and the first angular error dθA included in the first detected angle value θAs. Portion (b) of FIG. 24 shows the relationship between the second detected angle value θBs and the second angular error dθB included in the second detected angle value θBs. In the example shown in FIG. 24, the first angular error dθA and the second angular error dθB have an amplitude of ±0.17°. In the present embodiment, the third position and the fourth position are offset from the first position and the second position, respectively, by an amount equivalent to ½ the error period (electrical angle of 90°), and the detected angle values θAs and θBs differ in phase by ½ the error period (electrical angle of 90°). Therefore, when calculating the detected angle value θs, the first angular error dθA and the second angular error dθB are in opposite phases. Consequently, the first angular error dθA and the second angular error dθB cancel each other out.

Figure 25:
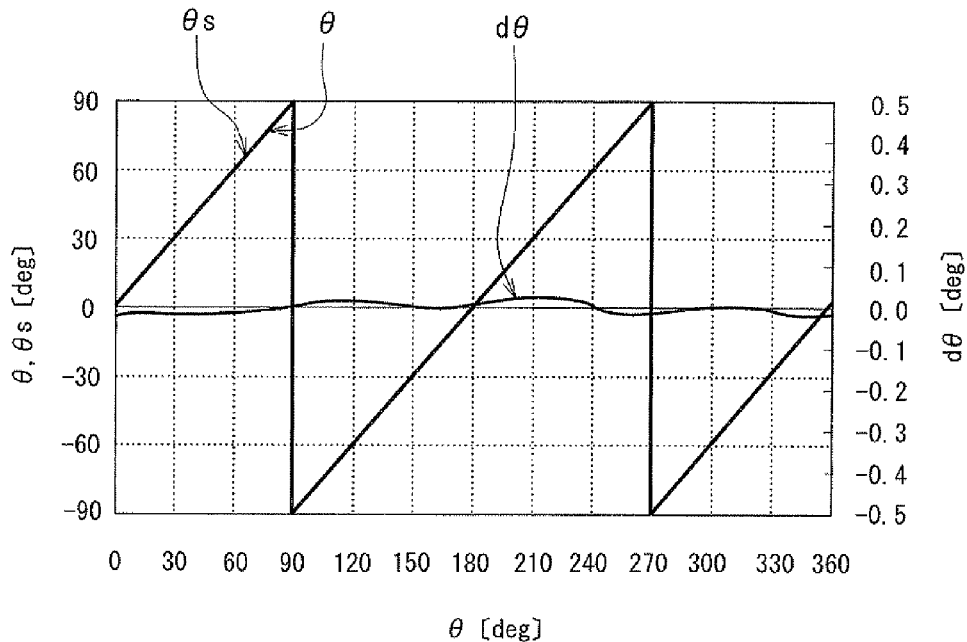
FIG. 25 is a waveform chart showing the relationship between a detected angle value and an angular error in the fifth embodiment of the invention.

FIG. 25 shows the relationship between the detected angle value θs calculated as described above and an angular error dθ included in the detected angle value θs. In FIG. 25, the angle that the direction of the rotating magnetic field in a reference position forms with respect to a reference direction is represented by symbol θ. As shown in FIG. 25, the angular error dθ is significantly smaller than the first angular error dθA and the second angular error dθB. In the example shown in FIG. 25, the angular error dθ has an amplitude of ±0.03°.

In the present embodiment, the third position and the fourth position are offset from the first position and the second position, respectively, by an amount equivalent to ½ the error period. However, the third position and the fourth position may be offset from the first position and the second position by an amount equivalent to an odd number of times ½ the error period. In such a case, the angular error dθA and the angular error dθB cancel each other out to significantly reduce the angular error dθ that is included in the detected angle value θs.

In the present embodiment, the phase difference between the first detected angle value θAs and the second detected angle value θBs is not limited to 90° in electrical angle, and may be of any value. Assuming that the phase difference between the first detected angle value θAs and the second detected angle value θBs is β, the seventh arithmetic circuit 211 calculates θs by the following equation (10):

$$\theta s = (\theta As + \theta Bs + \beta)/2 \quad (10)$$

The other configuration, operation, and effects of the present embodiment are the same as those of the fourth embodiment.

Sixth Embodiment

A rotating field sensor according to a sixth embodiment of the invention will now be described. The rotating field sensor 141 according to the present embodiment is capable of reducing both an angular error component that results from the MR elements and an angular error component that results from the rotating magnetic field.

Figure 26:
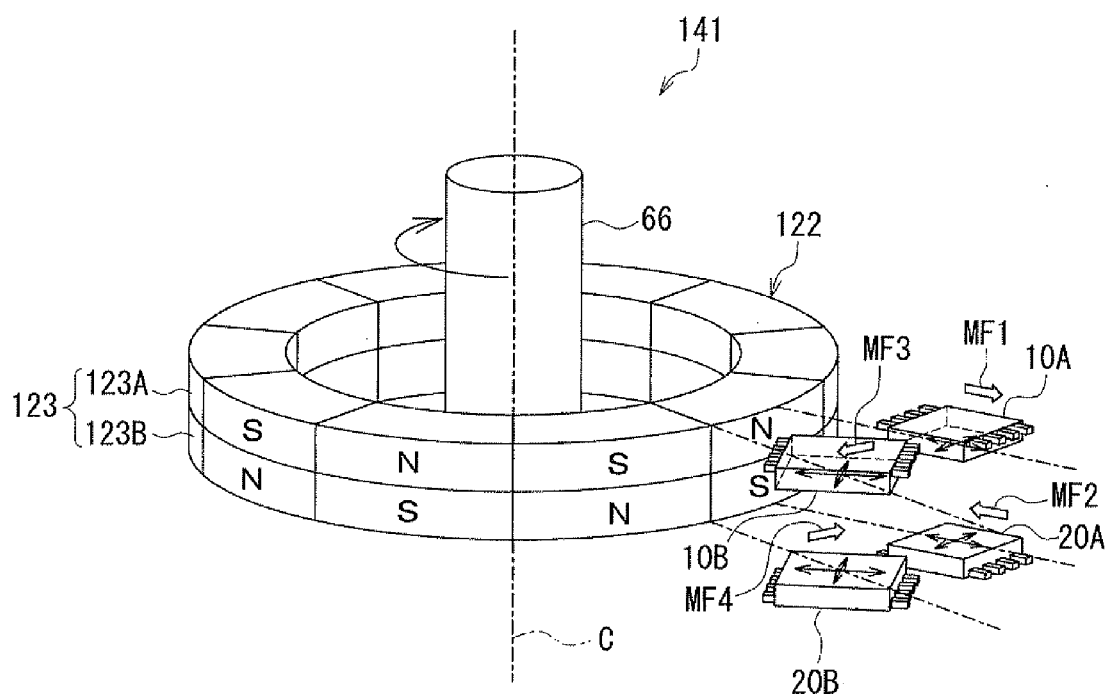
FIG. 26 is a perspective view showing the general configuration of a rotating field sensor according to a sixth embodiment of the invention.

With reference to FIG. 26, the configuration of the rotating field sensor 141 according to the present embodiment will be described first. FIG. 26 is a perspective view showing the general configuration of the rotating field sensor 141 according to the present embodiment. The configuration of the rotating field sensor 141 is basically the same as that of the rotating field sensor 121 according to the fifth embodiment shown in FIG. 21. In the present embodiment, the first detected angle value θAs obtained by the detection of the first and second applied fields differs from the second detected angle value θBs obtained by the detection of the third and fourth applied fields in phase by an odd number of times the electrical angle of 45°. To achieve such a difference, in the example shown in FIG. 26, the third and fourth detection units 10B and 20B are arranged in an orientation different from that shown in FIG. 21. In the example shown in FIG. 26, the third and fourth detection units 10B and 20B are each situated in an orientation 45° rotated from the state shown in FIG. 21 within a virtual plane perpendicular to the center of rotation C. Here, the third and fourth detection units 10B and 20B are rotated about an axis that passes the centers of the detection units 10B and 20B and is parallel to the center of rotation C. The first and second detection units 10A and 20A are in the same orientation as shown in FIG. 21.

Figure 27:
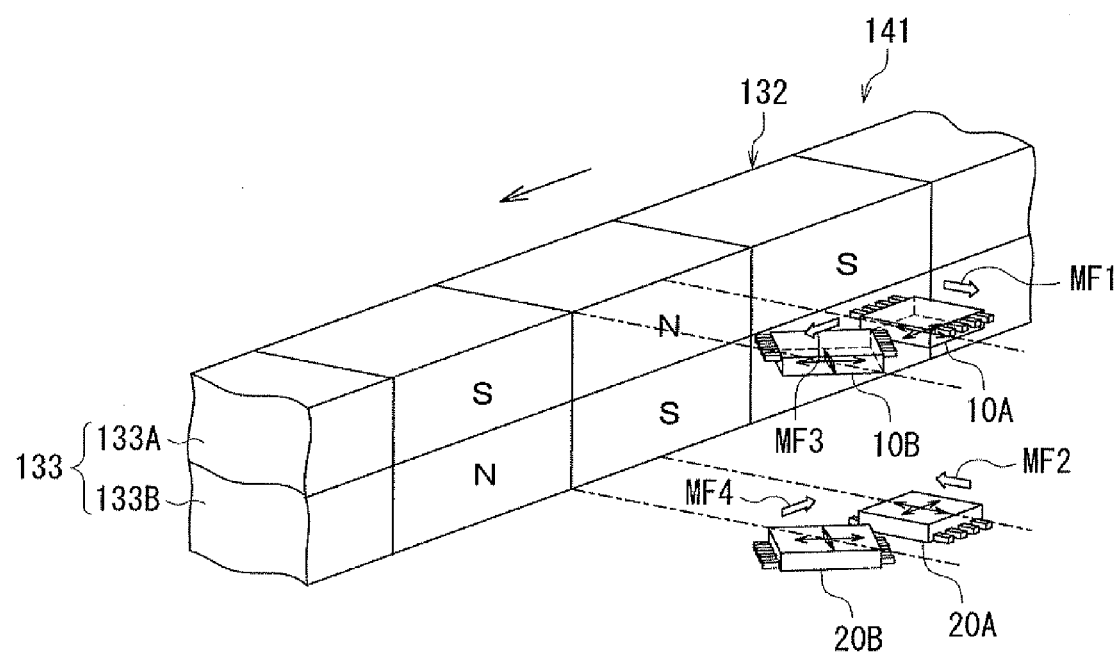
FIG. 27 is a perspective view showing the general configuration of a rotating field sensor of a modification example of the sixth embodiment of the invention.

Reference is now made to FIG. 27 to describe the configuration of a rotating field sensor 141 of a modification example of the present embodiment. FIG. 27 is a perspective view showing the general configuration of the rotating field sensor 141 of the modification example of the present embodiment.

The configuration of the rotating field sensor 141 of the modification example is basically the same as that of the rotating field sensor 121 of the modification example of the fifth embodiment shown in FIG. 22. In this modification example, the third and fourth detection units 10B and 20B have a different orientation from that shown in FIG. 22. Specifically, the third detection unit 10B is situated in an orientation 45° rotated from the state shown in FIG. 22 within a virtual plane on which the detection units 10A and 10B are arranged, about an axis that passes the center of the detection unit 10B and is perpendicular to the virtual plane. The fourth detection unit 20B is situated in an orientation 45° rotated from the state shown in FIG. 22 within a virtual plane on which the detection units 20A and 20B are arranged, about an axis that passes the center of the detection unit 20B and is perpendicular to the virtual plane. It should be appreciated that instead of arranging the detection units 10B and 20B in the foregoing orientation, the directions of magnetization of the magnetization pinned layers in the MR elements that are included in the detection units 10B and 20B may be rotated by 45° with respect to those of the fifth embodiment. Otherwise, the detection unit 10A may be situated in an orientation −45° rotated from the state shown in FIG. 22 within the virtual plane on which the detection units 10A and 10B are arranged, about an axis that passes the center of the detection unit 10A and is perpendicular to the virtual plane. In such a case, the detection unit 20A is also situated in an orientation −45° rotated from the state shown in FIG. 22 within the virtual plane on which the detection units 20A and 20B are arranged, about an axis that passes the center of the detection unit 20A and is perpendicular to the virtual plane. Alternatively, the directions of magnetization of the magnetization pinned layers in the MR elements that are included in the detection units 10A and 20A may be rotated by −45° with respect to those of the fifth embodiment.

Next, the method of calculating the detected angle value θs of the present embodiment will be described. In the examples shown in FIG. 26 and FIG. 27, as in the fifth embodiment, the third and fourth detection units 10B and 20B are located in positions offset from the positions of the first and second detection units 10A and 20A, respectively, by an amount equivalent to an electrical angle of 90°. In the examples shown in FIG. 26 and FIG. 27, the third and fourth detection units 10B and 20B are also situated in an orientation rotated by 45° as described above. The second detected angle value θBs therefore differs in phase from the first detected angle value θAs by an electrical angle of 90°+an electrical angle of 45°, i.e., an electrical angle of 135° (three times the electrical angle of 45°). In such examples, the seventh arithmetic circuit 211 calculates the detected angle value θs by the following equation (11):

$$\theta s = (\theta As + \theta Bs + \pi/2 + \pi/4)/2. \quad (11)$$

Next, it will be described that the angular error sometimes includes both an angular error component resulting from the rotating magnetic field and an angular error component resulting from the MR elements. In the examples shown in FIG. 26 and FIG. 27, as described in the fifth embodiment, each of the first and second detected angle values θAs and θBs can include an angular error component resulting from the rotating magnetic field. As described in the fourth embodiment, each of the first and second detected angle values θAs and θBs can also include an angular error component resulting from the MR elements.

For such reasons, each of the first angular error dθA of the first detected angle value θAs and the second angular error dθB of the second detected angle value θBs sometimes includes a first error component that results from the rotating magnetic field and a second error component that results from the MR elements. The first error component changes depending on a change of the direction of the rotating magnetic field, with a first error period which is ½ the period of the rotation of the direction of the rotating magnetic field, i.e., an electrical angle of 180°. The second error component changes with a second error period which is ¼ the period of the output signals of the first to eighth detection circuits 11A, 12A, 21A, 22A, 11B, 12B, 21B, and 22B (see FIG. 16), i.e., an electrical angle of 90°.

Next, the effects of the rotating field sensor 141 will be described. In the present embodiment, the third position where the third detection unit 10B is located and the fourth position where the fourth detection unit 20B is located are offset from the first position where the first detection unit 10A is located and the second position where the second detection unit 20A is located, respectively, by an amount equivalent to ½ the first error period (electrical angle of 90°). When calculating the detected angle value θs, the first error component of the first angular error dθA and the first error component of the second angular error dθB are thus in opposite phases. Consequently, the first error component of the first angular error dθA and the first error component of the second angular error dθB cancel each other out.

Moreover, in the present embodiment, the first detected angle value θAs and the second detected angle value θBs are given a difference in phase by an odd number of times ½ of the second error period (an electrical angle of 45°). When calculating the detected angle value θs, the second error component of the first angular error dθA and the second error component of the second angular error dθB are thus in opposite phases. Consequently, the second error component of the first angular error dθA and the second error component of the second angular error dθB cancel each other out.

With the operation described above, it is possible according to the present embodiment to reduce both the angular error component that results from the MR elements and the angular error component that results from the rotating magnetic field.

In the present embodiment, as in the fifth embodiment, the third position and the fourth position may be offset from the first position and the second position by an amount equivalent to an odd number of times ½ the first error period. The other configuration, operation, and effects of the present embodiment are the same as those of the fifth embodiment.

The present invention is not limited to the foregoing embodiments, and various modifications may be made thereto. For example, the arrangement of the plurality of detection units in the foregoing embodiments are illustrative only. Various modifications may be made to the arrangement of the plurality of detection units within the scope of the requirements set forth in the claims.

In the first embodiment, the first direction and the third direction may be the same. In such a case, the output signal sin θ2 of the third detection circuit 21 differs from the output signal sin θ1 of the first detection circuit 11 in phase by ½ the period T, i.e., by π(180°), and the noise component included in the output signal sin θ1 and that included in the output signal sin θ2, resulting from the first component of the noise field $H_{ext}$, both have a positive value (Es). In this case, the first signal sin θs is determined by, for example, subtracting the output signal sin θ2 from the output signal sin θ1. This allows the noise component included in the output signal sin θ1 and that included in the output signal sin θ2 to cancel each other out. Similarly, the second direction and the fourth direction may be the same. In such a case, the output signal cos θ2 of the fourth detection circuit 22 can be subtracted from the output signal cos θ1 of the second detection circuit 12, for example. This allows the noise component included in the output signal cos θ1 and that included in the output signal cos θ2, resulting from the second component of the noise field $H_{ext}$, to cancel each other out.

It is apparent that the present invention can be carried out in various forms and modifications in the light of the foregoing descriptions. Accordingly, within the scope of the following claims and equivalents thereof, the present invention can be carried out in forms other than the foregoing most preferable embodiments.

What is claimed is:

1. A rotating field sensor for detecting an angle that a direction of a rotating magnetic field in a reference position forms with respect to a reference direction, the rotating field sensor comprising:

a field generation unit that generates the rotating magnetic field, the rotating magnetic field including a first partial magnetic field in a first position and a second partial magnetic field in a second position, the first partial magnetic field and the second partial magnetic field differing in direction by 180° and rotating in the same direction of rotation;

a first detection unit that detects a first applied field in the first position, the first applied field including the first partial magnetic field as its main component; and a second detection unit that detects a second applied field in the second position, the second applied field including the second partial magnetic field as its main component, wherein:

the first detection unit has a first detection circuit that detects an intensity of a component of the first applied field in a first direction and outputs a signal indicating the intensity, and a second detection circuit that detects an intensity of a component of the first applied field in a second direction and outputs a signal indicating the intensity;

the second detection unit has a third detection circuit that detects an intensity of a component of the second applied field in a third direction and outputs a signal indicating the intensity, and a fourth detection circuit that detects an intensity of a component of the second applied field in a fourth direction and outputs a signal indicating the intensity;

the first direction and the third direction are parallel to each other;

the second direction and the fourth direction are parallel to each other;

each of the first to fourth detection circuits includes at least one magnetic detection element;

the output signals of the first to fourth detection circuits have the same period;

the output signal of the second detection circuit differs from the output signal of the first detection circuit in phase by an odd number of times ¼ the period;

the output signal of the third detection circuit differs from the output signal of the first detection circuit in phase by an integer multiple of ½ the period; and the output signal of the fourth detection circuit differs from the output signal of the third detection circuit in phase by an odd number of times ¼ the period, the rotating field sensor further comprising:

a first arithmetic circuit that generates a first signal having a correspondence relationship with both the intensity of the component of the first applied field in the first direction and the intensity of the component of the second applied field in the third direction, based on the output signals of the first and third detection circuits;

a second arithmetic circuit that generates a second signal having a correspondence relationship with both the intensity of the component of the first applied field in the second direction and the intensity of the component of the second applied field in the fourth direction, based on the output signals of the second and fourth detection circuits; and a third arithmetic circuit that calculates a detected angle value having a correspondence relationship with the angle that the direction of the rotating magnetic field in the reference position forms with respect to the reference direction, based on the first and second signals.

2. The rotating field sensor according to claim 1, wherein:
a noise field other than the rotating magnetic field is applied to the rotating field sensor;
the first applied field is a composite magnetic field resulting from a combination of the first partial magnetic field and the noise field; and
the second applied field is a composite magnetic field resulting from a combination of the second partial magnetic field and the noise field.

3. The rotating field sensor according to claim 1, wherein the first direction and the third direction are different from each other by 180°, and the second direction and the fourth direction are different from each other by 180°.

4. The rotating field sensor according to claim 1, wherein each of the first to fourth detection circuits includes, as the at least one magnetic detection element, a pair of magnetic detection elements connected in series.

5. The rotating field sensor according to claim 4, wherein each of the first to fourth detection circuits has a Wheatstone bridge circuit that includes a first pair of magnetic detection elements connected in series and a second pair of magnetic detection elements connected in series.

6. The rotating field sensor according to claim 4, wherein the magnetic detection elements are magnetoresistive elements.

7. The rotating field sensor according to claim 6, wherein each of the magnetoresistive elements has a magnetization pinned layer whose direction of magnetization is pinned, a free layer whose direction of magnetization varies according to the direction of a magnetic field applied thereto, and a nonmagnetic layer disposed between the magnetization pinned layer and the free layer.

8. The rotating field sensor according to claim 7, wherein:
the directions of magnetization of the magnetization pinned layers of the magnetoresistive elements in the second detection circuit are orthogonal to those of the magnetization pinned layers of the magnetoresistive elements in the first detection circuit; and
the directions of magnetization of the magnetization pinned layers of the magnetoresistive elements in the fourth detection circuit are orthogonal to those of the magnetization pinned layers of the magnetoresistive elements in the third detection circuit.

9. The rotating field sensor according to claim 1, wherein the rotating magnetic field further includes a third partial magnetic field in a third position and a fourth partial magnetic field in a fourth position, the third partial magnetic field and the fourth partial magnetic field differing in direction by 180° and rotating in the same direction of rotation as the direction of rotation of the first and second partial magnetic fields, the rotating field sensor further comprising:

a third detection unit that detects a third applied field in the third position, the third applied field including the third partial magnetic field as its main component; and a fourth detection unit that detects a fourth applied field in the fourth position, the fourth applied field including the fourth partial magnetic field as its main component, wherein:

the third detection unit has a fifth detection circuit that detects an intensity of a component of the third applied field in a fifth direction and outputs a signal indicating the intensity, and a sixth detection circuit that detects an intensity of a component of the third applied field in a sixth direction and outputs a signal indicating the intensity;

the fourth detection unit has a seventh detection circuit that detects an intensity of a component of the fourth applied field in a seventh direction and outputs a signal indicating the intensity, and an eighth detection circuit that detects an intensity of a component of the fourth applied field in an eighth direction and outputs a signal indicating the intensity;

the fifth direction and the seventh direction are parallel to each other;

the sixth direction and the eighth direction are parallel to each other;

each of the fifth to eighth detection circuits includes at least one magnetic detection element;

the output signals of the first to eighth detection circuits have the same period;

the output signal of the sixth detection circuit differs from the output signal of the fifth detection circuit in phase by an odd number of times ¼ the period;

the output signal of the seventh detection circuit differs from the output signal of the fifth detection circuit in phase by an integer multiple of ½ the period; and the output signal of the eighth detection circuit differs from the output signal of the seventh detection circuit in phase by an odd number of times ¼ the period, the rotating field sensor further comprising:

a fourth arithmetic circuit that generates a third signal having a correspondence relationship with both the intensity of the component of the third applied field in the fifth direction and the intensity of the component of the fourth applied field in the seventh direction, based on the output signals of the fifth and seventh detection circuits;

a fifth arithmetic circuit that generates a fourth signal having a correspondence relationship with both the intensity of the component of the third applied field in the sixth direction and the intensity of the component of the fourth applied field in the eighth direction, based on the output signals of the sixth and eighth detection circuits;

a sixth arithmetic circuit that calculates a second detected angle value having a correspondence relationship with the angle that the direction of the rotating magnetic field in the reference position forms with respect to the reference direction, based on the third and fourth signals; and a seventh arithmetic circuit that calculates a detected value of the angle that the direction of the rotating magnetic field in the reference position forms with respect to the reference direction, based on a first detected angle value, which is the detected angle value calculated by the third arithmetic circuit, and the second detected angle value calculated by the sixth arithmetic circuit.

10. The rotating field sensor according to claim 9, wherein:
a noise field other than the rotating magnetic field is applied to the rotating field sensor from outside;

the first applied field is a composite magnetic field resulting from a combination of the first partial magnetic field and the noise field;

the second applied field is a composite magnetic field resulting from a combination of the second partial magnetic field and the noise field;

the third applied field is a composite magnetic field resulting from a combination of the third partial magnetic field and the noise field; and the fourth applied field is a composite magnetic field resulting from a combination of the fourth partial magnetic field and the noise field.

11. The rotating field sensor according to claim 9, wherein the first direction and the third direction are different from each other by 180°, the second direction and the fourth direction are different from each other by 180°, the fifth direction and the seventh direction are different from each other by 180°, and the sixth direction and the eighth direction are different from each other by 180°.

12. The rotating field sensor according to claim 9, wherein:
the first detected angle value includes a first angular error with respect to a theoretical value of the first detected angle value that is expected when the first applied field consists only of the first partial magnetic field, the second applied field consists only of the second partial magnetic field, and the directions of the first and second partial magnetic fields make an ideal rotation;

the second detected angle value includes a second angular error with respect to a theoretical value of the second detected angle value that is expected when the third applied field consists only of the third partial magnetic field, the fourth applied field consists only of the fourth partial magnetic field, and the directions of the third and fourth partial magnetic fields make an ideal rotation;

the first and second angular errors make periodic changes with the same error period in response to a change of the directions of the first to fourth partial magnetic fields, the change of the first angular error depending on a change of the first detected angle value, the change of the second angular error depending on a change of the second detected angle value; and the first detected angle value and the second detected angle value differ in phase by an odd number of times ½ the error period.

13. The rotating field sensor according to claim 12, wherein the third position and the fourth position are offset from the first position and the second position, respectively, by an amount equivalent to an odd number of times ½ the error period.

14. The rotating field sensor according to claim 12, wherein the error period is ¼ the period of the output signals of the detection circuits.

15. The rotating field sensor according to claim 9, wherein:
the first detected angle value includes a first angular error with respect to a theoretical value of the first detected angle value that is expected when the first applied field consists only of the first partial magnetic field, the second applied field consists only of the second partial magnetic field, and the directions of the first and second partial magnetic fields make an ideal rotation;

the second detected angle value includes a second angular error with respect to a theoretical value of the second detected angle value that is expected when the third applied field consists only of the third partial magnetic field, the fourth applied field consists only of the fourth partial magnetic field, and the directions of the third and fourth partial magnetic fields make an ideal rotation;

the first and second angular errors make periodic changes with the same error period in response to a change of the directions of the first to fourth partial magnetic fields, the change of the first angular error depending on a change of the directions of the first and second partial magnetic fields, the change of the second angular error depending on a change of the directions of the third and fourth magnetic fields; and the third position and the fourth position are offset from the first position and the second position, respectively, by an amount equivalent to an odd number of times ½ the error period.

16. The rotating field sensor according to claim 15, wherein the error period is ½ the period of the rotation of the direction of the rotating magnetic field.

17. The rotating field sensor according to claim 15, wherein:
the first angular error includes a component that changes with the error period depending on the change of the directions of the first and second partial magnetic fields, and a component that changes with a second error period depending on a change of the first detected angle value;

the second angular error includes a component that changes with the error period depending on the change of the directions of the third and fourth partial magnetic fields, and a component that changes with the second error period depending on a change of the second detected angle value; and the first detected angle value and the second detected angle value differ in phase by an odd number of times ½ the second error period.

* * * * *